United States Patent
Hartig

(10) Patent No.: US 9,376,853 B2
(45) Date of Patent: Jun. 28, 2016

(54) HIGH QUALITY REFLECTANCE COATINGS

(71) Applicant: Cardinal CG Company, Eden Prairie, MN (US)

(72) Inventor: Klaus Hartig, Avoca, WI (US)

(73) Assignee: Cardinal CG Company, Eden Prairie, MN (US)

( * ) Notice: Subject to any disclaimer, the term of this patent is extended or adjusted under 35 U.S.C. 154(b) by 0 days.

(21) Appl. No.: 14/052,975

(22) Filed: Oct. 14, 2013

(65) Prior Publication Data

US 2014/0065328 A1 Mar. 6, 2014

Related U.S. Application Data

(63) Continuation of application No. 13/646,873, filed on Oct. 8, 2012, now Pat. No. 8,586,215, which is a continuation of application No. 12/851,269, filed on Aug. 5, 2010, now Pat. No. 8,283,059, which is a continuation of application No. 11/546,152, filed on Oct. 11, 2006, now abandoned, which is a continuation-in-part of application No. 11/398,345, filed on Apr. 5, 2006, now Pat. No. 7,342,716, which is a continuation-in-part of application No. 11/360,266, filed on Feb. 23, 2006, now Pat. No. 7,339,728.

(60) Provisional application No. 60/725,891, filed on Oct. 11, 2005.

(51) Int. Cl.
  *E06B 3/67*  (2006.01)
  *C03C 17/36*  (2006.01)
  *C23C 14/56*  (2006.01)

(52) U.S. Cl.
  CPC .............. *E06B 3/6715* (2013.01); *C03C 17/36* (2013.01); *C03C 17/366* (2013.01); *C03C 17/3613* (2013.01); *C03C 17/3626* (2013.01); *C03C 17/3639* (2013.01); *C03C 17/3644* (2013.01); *C03C 17/3652* (2013.01); *C03C 17/3681* (2013.01); *C23C 14/568* (2013.01); *C03C 2217/78* (2013.01); *C03C 2218/153* (2013.01); *C03C 2218/154* (2013.01); *Y10T 428/2495* (2015.01); *Y10T 428/24612* (2015.01); *Y10T 428/24942* (2015.01); *Y10T 428/24975* (2015.01); *Y10T 428/31504* (2015.04)

(58) Field of Classification Search
  None
  See application file for complete search history.

(56) References Cited

U.S. PATENT DOCUMENTS 3,272,986 A  9/1966  Schmidt
3,649,359 A  3/1972  Apfel
(Continued)

FOREIGN PATENT DOCUMENTS

CA  2525749 C  4/2009
CA  2535829 C  5/2010
(Continued)

OTHER PUBLICATIONS

H.A. Macleod, Thin Film Optical Filters, 3rd Ed. "Band Pass Filters" Ch 7, pp. 257-347.
(Continued)

*Primary Examiner* — Vera Katz
(74) *Attorney, Agent, or Firm* — Fredrickson & Byron, P.A.

(57) ABSTRACT

Low-emissivity coatings that are highly reflective to infrared-radiation. The coating includes three infrared-reflection film regions, which may each include silver.

3 Claims, 13 Drawing Sheets

(56) References Cited

U.S. PATENT DOCUMENTS

| | | | |
|---|---|---|---|
| 3,962,488 A | 6/1976 | Gillery | |
| 3,990,784 A | 11/1976 | Gelber | |
| 4,017,661 A | 4/1977 | Gillery | |
| 4,045,125 A | 8/1977 | Farges | |
| 4,098,956 A | 7/1978 | Blickensderfer | |
| 4,101,200 A | 7/1978 | Daxinger | |
| 4,166,018 A | 8/1979 | Chapin | |
| 4,169,655 A | 10/1979 | Jacobsson | |
| 4,194,022 A | 3/1980 | Gillery | |
| 4,204,942 A | 5/1980 | Chahroudi | |
| 4,337,990 A | 7/1982 | Fan | |
| 4,368,945 A * | 1/1983 | Fujimori et al. | 359/360 |
| 4,379,040 A | 4/1983 | Gillery | |
| 4,413,877 A | 11/1983 | Suzuki | |
| 4,462,883 A | 7/1984 | Hart | |
| 4,497,700 A | 2/1985 | Groth | |
| 4,546,050 A | 10/1985 | Amberger | |
| 4,556,599 A | 12/1985 | Sato | |
| 4,619,729 A | 10/1986 | Johncock | |
| 4,622,120 A | 11/1986 | Gillery | |
| 4,715,879 A | 12/1987 | Schmitte | |
| 4,737,379 A | 4/1988 | Hudgens | |
| 4,790,922 A | 12/1988 | Huffer | |
| 4,806,220 A | 2/1989 | Finley | |
| 4,828,346 A | 5/1989 | Jacobson | |
| 4,859,532 A | 8/1989 | Oyama | |
| 4,898,789 A | 2/1990 | Finley | |
| 4,898,790 A | 2/1990 | Finley | |
| 4,902,081 A | 2/1990 | Huffer | |
| 4,943,484 A | 7/1990 | Goodman | |
| 4,960,310 A | 10/1990 | Cushing | |
| 4,965,121 A | 10/1990 | Young | |
| 4,976,503 A * | 12/1990 | Woodard | 359/360 |
| 4,996,105 A | 2/1991 | Oyama | |
| 5,059,295 A | 10/1991 | Finley | |
| 5,071,206 A | 12/1991 | Hood | |
| 5,085,926 A | 2/1992 | Iida et al. | |
| 5,110,662 A | 5/1992 | Depauw | |
| 5,189,551 A * | 2/1993 | Woodard | 359/360 |
| 5,201,926 A | 4/1993 | Szczyrbowski | |
| 5,229,881 A | 7/1993 | Day | |
| 5,279,722 A | 1/1994 | Szczyrbowski | |
| 5,296,302 A | 3/1994 | O'Shaughnessy | |
| 5,332,888 A | 7/1994 | Tausch | |
| 5,337,191 A | 8/1994 | Austin | |
| 5,344,718 A | 9/1994 | Hartig | |
| 5,425,861 A | 6/1995 | Hartig | |
| 5,514,485 A | 5/1996 | Ando | |
| 5,557,462 A | 9/1996 | Hartig | |
| 5,591,529 A | 1/1997 | Braatz | |
| 5,595,825 A | 1/1997 | Guiselin | |
| 5,770,321 A | 6/1998 | Hartig | |
| 5,800,933 A | 9/1998 | Hartig | |
| 5,965,246 A | 10/1999 | Guiselin | |
| 6,007,901 A | 12/1999 | Maschwitz | |
| 6,014,872 A | 1/2000 | Hartig | |
| 6,059,909 A | 5/2000 | Hartig | |
| 6,090,481 A | 7/2000 | DePauw | |
| 6,104,530 A | 8/2000 | Okamura | |
| 6,193,856 B1 | 2/2001 | Kida | |
| 6,235,398 B1 | 5/2001 | Nakamura | |
| 6,262,830 B1 | 7/2001 | Scalora | |
| RE37,446 E | 11/2001 | Miyazaki | |
| 6,316,110 B1 | 11/2001 | Anzaki | |
| 6,334,938 B2 | 1/2002 | Kida | |
| 6,340,529 B1 | 1/2002 | Ebisawa | |
| 6,343,167 B1 | 1/2002 | Scalora | |
| 6,346,174 B1 | 2/2002 | Finley | |
| 6,398,925 B1 | 6/2002 | Arbab | |
| 6,432,545 B1 | 8/2002 | Schicht | |
| 6,461,686 B1 | 10/2002 | Vanderstraeten | |
| 6,468,402 B1 | 10/2002 | Vanderstraeten | |
| 6,511,587 B2 | 1/2003 | Vanderstraeten | |
| 6,533,904 B2 | 3/2003 | Ebisawa | |
| 6,569,516 B1 | 5/2003 | Nakamura | |
| 6,576,349 B2 | 6/2003 | Lingle | |
| 6,582,809 B2 | 6/2003 | Boire | |
| 6,650,478 B1 | 11/2003 | DeBusk | |
| 6,680,134 B2 | 1/2004 | Maurer | |
| 6,830,791 B1 | 12/2004 | Misonou | |
| 6,838,159 B2 | 1/2005 | Eby | |
| 6,855,369 B2 | 2/2005 | Nakamura | |
| 6,919,133 B2 | 7/2005 | Hartig | |
| 6,974,630 B1 | 12/2005 | Stachowiak | |
| 6,992,826 B2 | 1/2006 | Wang | |
| 7,060,359 B2 | 6/2006 | Eby | |
| 7,192,647 B2 | 3/2007 | Hartig | |
| 7,339,728 B2 * | 3/2008 | Hartig | 359/360 |
| 7,342,716 B2 * | 3/2008 | Hartig | 359/360 |
| 7,462,397 B2 | 12/2008 | Lingle | |
| 7,572,509 B2 * | 8/2009 | Hartig | 428/432 |
| 7,572,510 B2 * | 8/2009 | Hartig | 428/432 |
| 7,572,511 B2 * | 8/2009 | Hartig | 428/432 |
| 7,906,203 B2 | 3/2011 | Hartig | |
| 7,910,229 B2 | 3/2011 | Medwick et al. | |
| 8,088,473 B2 * | 1/2012 | Hartig | 428/212 |
| 8,283,059 B2 * | 10/2012 | Hartig | 428/701 |
| 8,586,215 B2 * | 11/2013 | Hartig | 428/701 |
| 2001/0009221 A1 | 7/2001 | Anzaki | |
| 2001/0031365 A1 | 10/2001 | Anderson | |
| 2001/0044489 A1 | 11/2001 | Hugo | |
| 2002/0021495 A1 | 2/2002 | Lingle | |
| 2002/0031674 A1 | 3/2002 | Laird | |
| 2002/0054993 A1 | 5/2002 | Nagai | |
| 2002/0086164 A1 | 7/2002 | Anzaki | |
| 2002/0102352 A1 | 8/2002 | Hartig | |
| 2002/0118460 A1 | 8/2002 | Woolf | |
| 2002/0136905 A1 | 9/2002 | Medwick | |
| 2003/0165693 A1 | 9/2003 | Hartig | |
| 2003/0180547 A1 | 9/2003 | Buhay | |
| 2003/0198816 A1 | 10/2003 | Lingle | |
| 2003/0224181 A1 | 12/2003 | Finley | |
| 2003/0235719 A1 | 12/2003 | Grimal | |
| 2004/0009356 A1 * | 1/2004 | Medwick et al. | 428/432 |
| 2004/0115443 A1 | 6/2004 | Bond et al. | |
| 2004/0126591 A1 | 7/2004 | Schicht | |
| 2004/0175511 A1 | 9/2004 | Hartig | |
| 2004/0247929 A1 | 12/2004 | Buhay | |
| 2005/0145480 A1 | 7/2005 | Neuman | |
| 2005/0175845 A1 | 8/2005 | Stachowiak | |
| 2006/0280951 A1 | 12/2006 | Fleury | |
| 2007/0082124 A1 | 4/2007 | Hartig | |
| 2012/0107572 A1 | 5/2012 | Hartig | |

FOREIGN PATENT DOCUMENTS

| | | |
|---|---|---|
| CA | 2482528 C | 4/2011 |
| DE | 716153 C | 1/1942 |
| DE | 4211363 A1 | 10/1993 |
| DE | 19751711 A1 | 5/1999 |
| EP | 0035906 A3 | 12/1981 |
| EP | 0303109 A3 | 2/1990 |
| EP | 0456487 A3 | 9/1992 |
| EP | 0567735 A1 | 11/1993 |
| EP | 1155816 A1 | 11/2001 |
| EP | 1179516 A1 | 2/2002 |
| EP | 1044934 A3 | 8/2002 |
| FR | 2669325 B1 | 4/1993 |
| FR | 2862961 B1 | 2/2006 |
| FR | 2859721 B1 | 8/2006 |
| GB | 2027925 B | 1/1983 |
| GB | 2080339 B | 7/1984 |
| GB | 2126256 B | 6/1986 |
| GB | 2300133 A | 10/1996 |
| JP | 58202408 A | 11/1983 |
| JP | 03503755 A | 8/1991 |
| JP | 07149545 A | 6/1995 |
| JP | 4370650 B2 | 11/2009 |
| WO | WO 9002653 A1 | 3/1990 |
| WO | WO 9005439 A1 | 5/1990 |
| WO | WO 9008334 A1 | 7/1990 |
| WO | WO 9748649 A1 | 12/1997 |
| WO | WO 03093188 A1 | 11/2003 |
| WO | WO 2004061151 A1 | 7/2004 |

(56) References Cited

FOREIGN PATENT DOCUMENTS

| WO | WO 2005003049 A1 | 1/2005 |
|----|------------------|--------|
| WO | WO 2006041924 A3 | 4/2006 |
| WO | WO 2006080968 A3 | 8/2006 |
| WO | WO 2006105419 A1 | 10/2006 |

OTHER PUBLICATIONS

Saturation (color theory), Wikipedia.org (Dec. 21, 2006).
PPG Glass Technology Since 1883 brochure, Sep. 2003.
Solarban® Solar Control Low-E Glass 70XL, Oct. 2005.
Solarban® 70XL, Solar Control Low-E Glass, Jan. 2006.
Affidavit of Brian R. Basso, Nov. 9, 2007, 3 pages.
International Search Report and Written Opinion for International Application No. PCT/US2006/039565, dated Sep. 2, 2007, 11 pages.
International Preliminary Report on Patentability, dated Apr. 16, 2008 for PCT Application No. PCT/US2006/039565, 8 pages.
International Search Report and Written Opinion for International Application No. PCT/US2006/039735, dated Feb. 20, 2007, 12 pages.
International Preliminary Report on Patentability for International Application No. PCT/US2006/039735, dated Apr. 16, 2008, 7 pages.
International Search Report and Written Opinion for International Application No. PCT/US2006/039032, dated Feb. 15, 2007, 12 pages.
International Preliminary Report on Patentability for International Application number. PCT/US2006/039032, dated Apr. 16, 2008, 7 pages.
International Search Report and Written Opinion for International Application No. PCT/US2006/039550, dated Feb. 15, 2007, 13 pages.
International Preliminary Report on Patentability for PCT Application No. PCT/US2006/039550, dated Apr. 16, 2008, 9 pages.
International Search Report and Written Opinion for International Application No. PCT/US2006/039564, dated Feb. 15, 2007, 15 pages.
International Preliminary Report on Patentability for International Application No. PCT/US2006/039564, dated Apr. 16, 2008, 10 pages.

* cited by examiner

REFLECTANCE (%) AND TRANSMITTANCE (%) VS WAVELENGTH

REFLECTANCE (%) AND TRANSMITTANCE (%) VS WAVELENGTH

REFLECTANCE (%) AND TRANSMITTANCE (%) VS WAVELENGTH

HIGH QUALITY REFLECTANCE COATINGS

RELATED APPLICATIONS

The present application is a continuation of U.S. utility application Ser. No. 13/646,873, filed Oct. 8, 2012, issued as U.S. Pat. No. 8,586,215, which is a continuation of U.S. utility application Ser. No. 12/851,269, filed Aug. 5, 2010, issued as U.S. Pat. No. 8,283,059, which is a continuation of U.S. utility application Ser. No. 11/546,152, filed Oct. 11, 2006, now abandoned, which in turn is a continuation-in-part of U.S. utility application Ser. No. 11/398,345, filed Apr. 5, 2006, issued as U.S. Pat. No. 7,342,716, which in turn is a continuation-in-part of U.S. utility application Ser. No. 11/360,266, filed Feb. 23, 2006, issued as U.S. Pat. No. 7,339,728, which in turn claims priority to U.S. provisional application No. 60/725,891, filed Oct. 11, 2005, the entire contents of each which are incorporated herein by reference.

FIELD OF THE INVENTION

The present invention relates to thin film coatings for glass and other substrates. In particular, this invention relates to low-emissivity coatings that are reflective of infrared radiation. Also provided are methods and equipment for depositing thin film coatings.

BACKGROUND OF THE INVENTION

Low-emissivity coatings are well known in the art. Typically, they include one or two layers of infrared-reflection film and two or more layers of transparent dielectric film. The infrared-reflection film, which generally is a conductive metal like silver, gold, or copper, reduces the transmission of heat through the coating. The dielectric films are used to anti-reflect the infrared-reflection films in selected spectral regions (visible region of sun light) and to control other properties and characteristics of the coating, such as color and durability. Commonly used dielectric materials include oxides of zinc, tin, indium, bismuth, and titanium, among others.

Most commercially available low-emissivity coatings have one or two silver layers each sandwiched between two coats of transparent dielectric film. Increasing the number of silver films in a low-emissivity coating can increase its infrared reflection. In commercial coating processes the Ag films are supported by growth support layers (below) and protective layers above. Especially the protective layers above can add some additional (to the silver films) absorption to the layer-stack. For multiple silver films in a layer stack this can add up to total absorption levels not acceptable for some applications. This will also reduce the visible transmission of the coating, and/or negatively impact the color of the coating, and/or decrease the durability of the coating. In some processes, growth support layers are provided beneath silver films and protective layers are provided above silver films. An increase in the number of growth support layers and protective layers in a low-emissivity coating can increase the overall absorption of the coating. This can be undesirable in some cases. Perhaps for these reasons, low-emissivity coatings with three silver layers have not found much place in the market.

It would be desirable to provide a low-emissivity coating that includes three infrared-reflection film regions and has desirable coating properties and characteristics. It would also be desirable to provide deposition methods and equipment that can produce high quality coatings of this nature.

SUMMARY OF THE INVENTION

In certain embodiments, the invention provides a method for depositing film onto a glass sheet. In the present embodiments, the method comprises providing a coater having a path of substrate travel extending through the coater.

The following description uses as an example a coater with horizontal substrate transport (referring to coating down and up to cover both surfaces).

It is well known that the same purposes can be achieved with a coater using (nearly) vertical glass transport. In such cases, the coating directions "up" and "down" are to be replaced by: left and right.

The expression "sputtering" or "magnetron sputtering" stand for the currently most common coating method, but it is obvious that any (large area) vacuum coating method can be used instead.

In-line with these coating stations can be treatment stations which are used to heat, cool, clean, activate or accomplish some plasma peening action.

It is also implied that if during the travel of substrates through the coating line different gas (mixes) and pressures are to be applied dynamic gas separation sections can be present.

Preferably, the coater includes downward coating equipment mounted above the path of substrate travel. The glass sheet is conveyed along the path of substrate travel in a generally horizontal orientation wherein a top major surface of the glass sheet is oriented upwardly and a bottom major surface of the glass sheet is oriented downwardly. The downward coating equipment is operated to deposit upon the top major surface of the glass sheet a coating that includes a sequence of at least seven film regions comprising, moving outwardly from the top major surface of the glass sheet, a first transparent dielectric film region, a first infrared-reflective film region comprising silver, a second transparent dielectric film region, a second infrared-reflective film region comprising silver, a third transparent dielectric film region, a third infrared-reflective film region comprising silver, and a fourth transparent dielectric film region. In the present embodiments, the method comprises depositing the noted film regions in a single pass of the glass sheet through the coater, and during this single pass the glass sheet is conveyed at a conveyance rate exceeding 275 inches per minute. A transparent dielectric film region can be made up from multiple sub-layers of different materials. These materials could, besides being chosen for their optical properties, be chosen to optimize electrical, mechanical, and/or chemical properties of the whole layer-stack before and/or after any optional heat treatment. In some of the present embodiments, the coater has an extended series of chambers including at least 60 sputtering chambers, the useful coating width has a major dimension of at least 2 meters, and the method comprises entirely coating both the top and bottom major surfaces of the glass sheet in the single pass of the glass sheet through the coater.

Certain embodiments of the invention provide a coater having an extended series of sputtering chambers and a substrate support defining a path of substrate travel extending through all the sputtering chambers of the coater. The substrate support (which in some embodiments comprise transport rollers, and in other embodiments comprises a conveyor or carriers) is adapted for conveying along the path of substrate travel a sheet-like substrate (such as a glass or plastic sheet) having multiple major dimensions optionally of greater than 2.0 meters. In the present embodiments, the coater has an upward sputtering section and a downward sputtering section.

There can also be sections sputtering up and down at the same time and location. The upward sputtering section is characterized by a series of lower targets mounted at lower elevation than the path of substrate travel, and the downward sputtering section is characterized by a series of upper targets mounted at higher elevation than the path of substrate travel. In the present embodiments, the downward sputtering section has at least 39 downward sputtering chambers each including at least one of the upper targets, and the upward sputtering section has a plurality of upward sputtering chambers each including at least one of the lower targets. In these embodiments, the downward sputtering chambers form at least seven downward deposition systems comprising, in sequence along the path of substrate travel, a first downward deposition system adapted for depositing a first transparent dielectric film region, a second downward deposition system adapted for depositing a first infrared-reflective film region comprising silver, a third downward deposition system adapted for depositing a second transparent dielectric film region, a fourth downward deposition system adapted for depositing a second infrared-reflective film region comprising silver, a fifth downward deposition system adapted for depositing a third transparent dielectric film region, a sixth downward deposition system adapted for depositing a third infrared-reflective film region comprising silver, and a seventh downward deposition system adapted for depositing a fourth transparent dielectric film region.

In certain embodiments, the invention provides a method for depositing film onto a glass sheet. In the present embodiments, the method involves providing a coater having an extended series of sputtering chambers and a path of substrate travel extending through all the sputtering chambers of the coater. In this group of embodiments, the coater's extended series of chambers includes at least 60 sputtering chambers, at least some of which are adapted for downward sputtering and include upper sputtering targets mounted above the path of substrate travel. The glass sheet is conveyed along the path of substrate travel, preferably in a generally horizontal orientation wherein a top major surface of the glass sheet is oriented upwardly and a bottom major surface of the glass sheet is oriented downwardly. In the present embodiments, the glass sheet is conveyed along at least a portion of the path of substrate travel at a conveyance rate of 300 inches per minute or faster, and at least a plurality of the upper targets are sputtered to deposit upon the top major surface of the glass sheet a coating comprising, moving outwardly from the top major surface of the glass sheet, a first transparent dielectric film region, a first infrared-reflective film region comprising silver, a second transparent dielectric film region, a second infrared-reflective film region comprising silver, a third transparent dielectric film region, a third infrared-reflective film region comprising silver, and a fourth transparent dielectric film region.

Certain embodiments of the invention provide a method for depositing film onto a sheet-like substrate. In the present embodiments, the method involves providing a coater having an extended series of sputtering chambers and a path of substrate travel extending through all the sputtering chambers of the coater. In these embodiments, the coater's extended series of sputtering chambers preferably includes at least 60 sputtering chambers at least some of which are adapted for downward sputtering and include upper sputtering targets mounted above the path of substrate travel. The substrate is conveyed along the path of substrate travel, preferably in a generally horizontal orientation wherein a top major surface of the substrate is oriented upwardly and a bottom major surface of the substrate is oriented downwardly. In the present embodiments, the substrate is conveyed along at least a portion of the path of travel at a conveyance rate exceeding 275 inches per minute. In the present embodiments, two series of the upper targets are sputtered in nitriding gas (optionally a mix of oxygen and nitrogen) to reactively sputter deposit over the top major surface of the substrate two transparent dielectric nitride film regions (the films may consist essentially of nitride, they may comprise oxynitride film, etc.), and an infrared-reflective film region is deposited between these two transparent dielectric nitride film regions. Here, the two noted transparent dielectric nitride film regions (and the infrared-reflective film region(s) between them) are part of a coating comprising, moving outwardly from the top major surface of the substrate, a first transparent dielectric film region, a first infrared-reflective film region comprising silver, a second transparent dielectric film region, a second infrared-reflective film region comprising silver, a third transparent dielectric film region, a third infrared-reflective film region comprising silver, and a fourth transparent dielectric film region.

In certain embodiments, the invention provides a method for depositing film onto a glass sheet. The method involves providing a coater having an extended series of sputtering chambers and a path of substrate travel extending through all the sputtering chambers of the coater. In the present embodiments, the coater's extended series of sputtering chambers includes at least 63 sputtering chambers at least some of which are adapted for downward sputtering and include upper sputtering targets mounted above the path of substrate travel. The glass sheet is conveyed along the path of substrate travel, preferably in a generally horizontal orientation wherein a top major surface of the glass sheet is oriented upwardly and a bottom major surface of the glass sheet is oriented downwardly. In the present embodiments, the glass sheet is conveyed along at least a portion of the path of substrate travel at a conveyance rate of 300 inches per minute or faster. In the present embodiments, two series of the upper targets are sputtered in nitriding gas to reactively sputter deposit (over the top major surface of the substrate) two transparent dielectric nitride film regions. At least one infrared-reflective film region is deposited between these two transparent dielectric nitride film regions, and the two noted transparent dielectric nitride film regions (and the infrared-reflective film region(s) between them), are part of a coating comprising, moving outwardly from the top major surface of the substrate, a first transparent dielectric film region, a first infrared-reflective film region comprising silver, a second transparent dielectric film region, a second infrared-reflective film region comprising silver, a third transparent dielectric film region, a third infrared-reflective film region comprising silver, and a fourth transparent dielectric film region. In the present embodiments, the method comprises sputter depositing dielectric film directly over at least one of the three noted infrared-reflective film regions comprising silver.

DETAILED DESCRIPTION OF PREFERRED EMBODIMENTS

Figure 1:
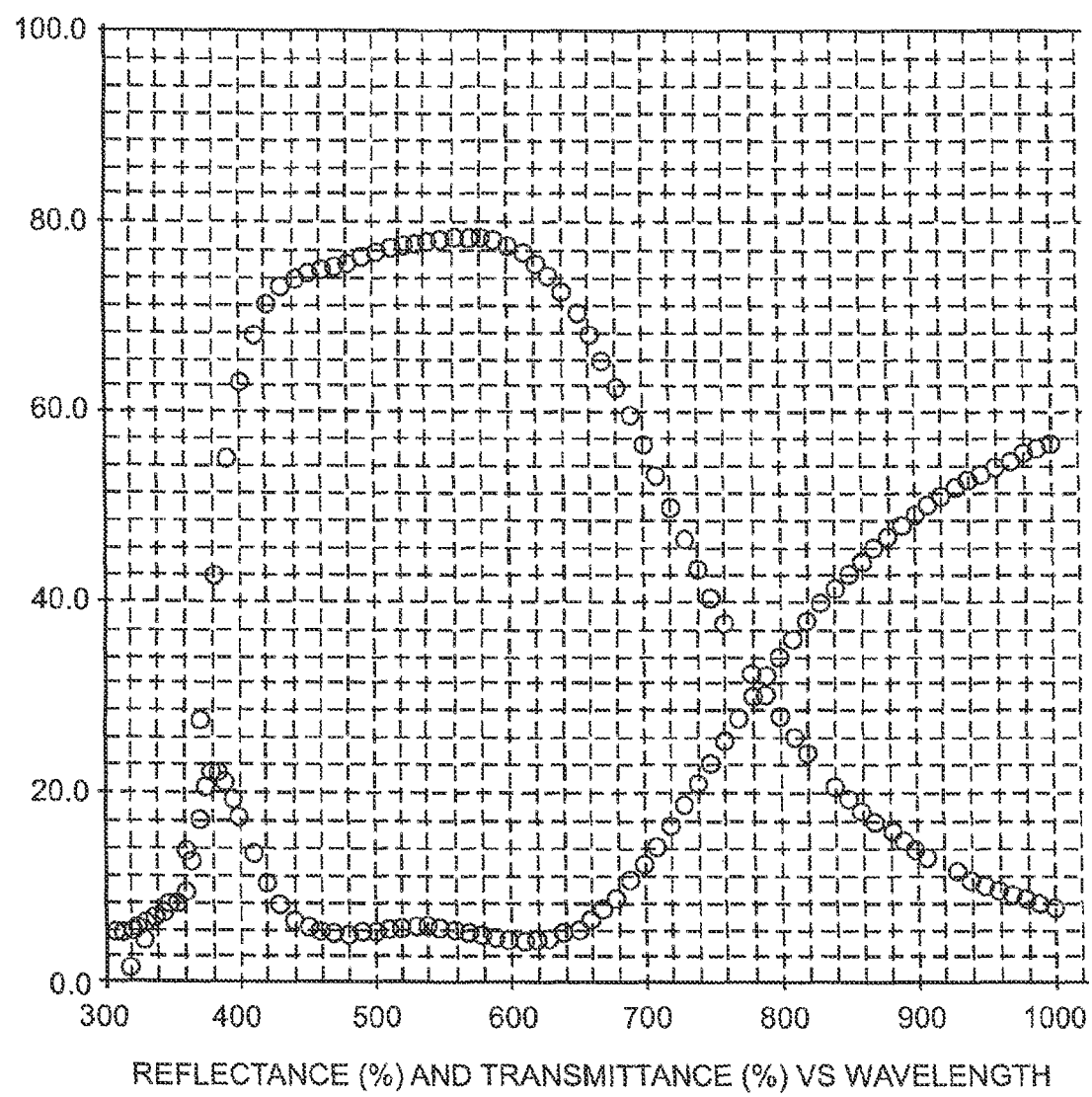
FIG. 1 is a graph showing the spectral properties of a commercially available double silver low-emissivity coating.

The following detailed description is to be read with reference to the drawings, in which like elements in different drawings have like reference numerals. The drawings, which are not necessarily to scale, depict selected embodiments and are not intended to limit the scope of the invention. Skilled artisans will recognize that the examples provided herein have many useful alternatives that fall within the scope of the invention.

Single and double silver low-emissivity coatings have been known in the art for years. Single silver low-emissivity coatings provide advantageous infrared reflection, commonly in the neighborhood of 96%. Double silver low-emissivity coatings offer further improvements in terms of improved spectral selectivity and higher solar infrared reflection. There are, however, practical ceilings on the infrared reflection levels that can be achieved using a double silver low-emissivity coating. For example, while increasing the amount of silver in a double silver coating may boost the infrared reflection above 97%, the road toward even higher infrared reflection, e.g., above 98.5%, is difficult to achieve in a double silver coating having a good balance of other properties (high visible transmission, good color, durability, etc.).

FIG. 1 is a graph showing the spectral properties of a highly advantageous commercially available double silver low-emissivity coating. This graph shows transmission (the curve that is upwardly convex in the visible wavelength range) and glass-side reflection (the curve that is downwardly concave in the visible wavelength range) for a glass sheet bearing the double silver low-emissivity coating. While this particular double silver coating offers excellent spectral properties, it has been reported that conventional double silver coatings allow anywhere from 5% to 50% transmission in the infrared wavelength range (U.S. Pat. No. 6,262,830, column 6, lines 43-51).

Figure 2:
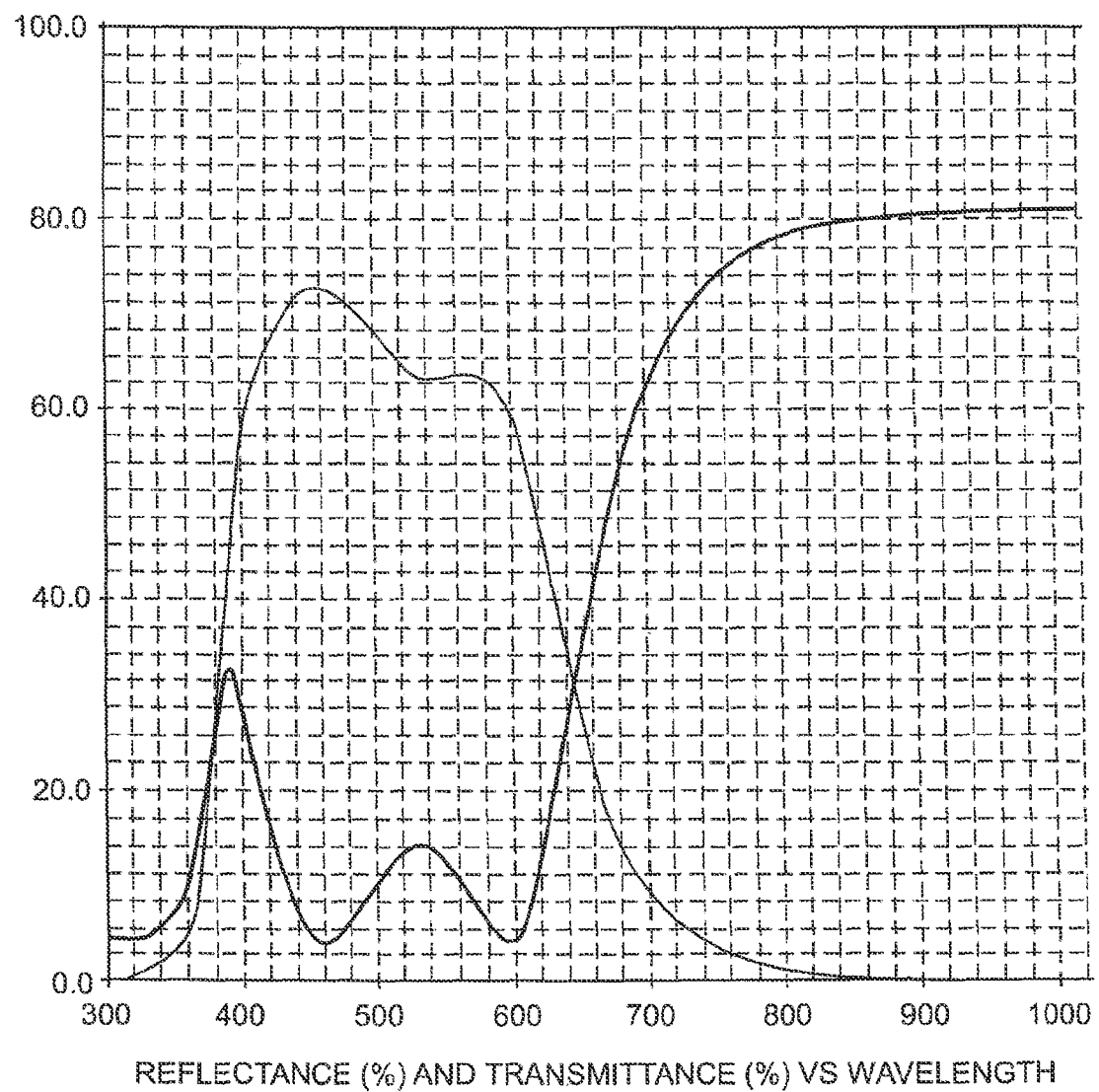
FIG. 2 is a graph showing the spectral properties of a high infrared reflection coating in accordance with certain embodiments of the present invention.

FIG. 2 is a graph showing the spectral properties (in the range of solar radiation) of a high infrared reflection coating in accordance with certain embodiments of the present invention. Here again, the graph shows transmission (the curve that is upwardly convex in the visible wavelength range) and glass-side reflection (the curve that is downwardly concave in the visible wavelength range) for a glass sheet bearing the high infrared reflection coating.

Figure 3:
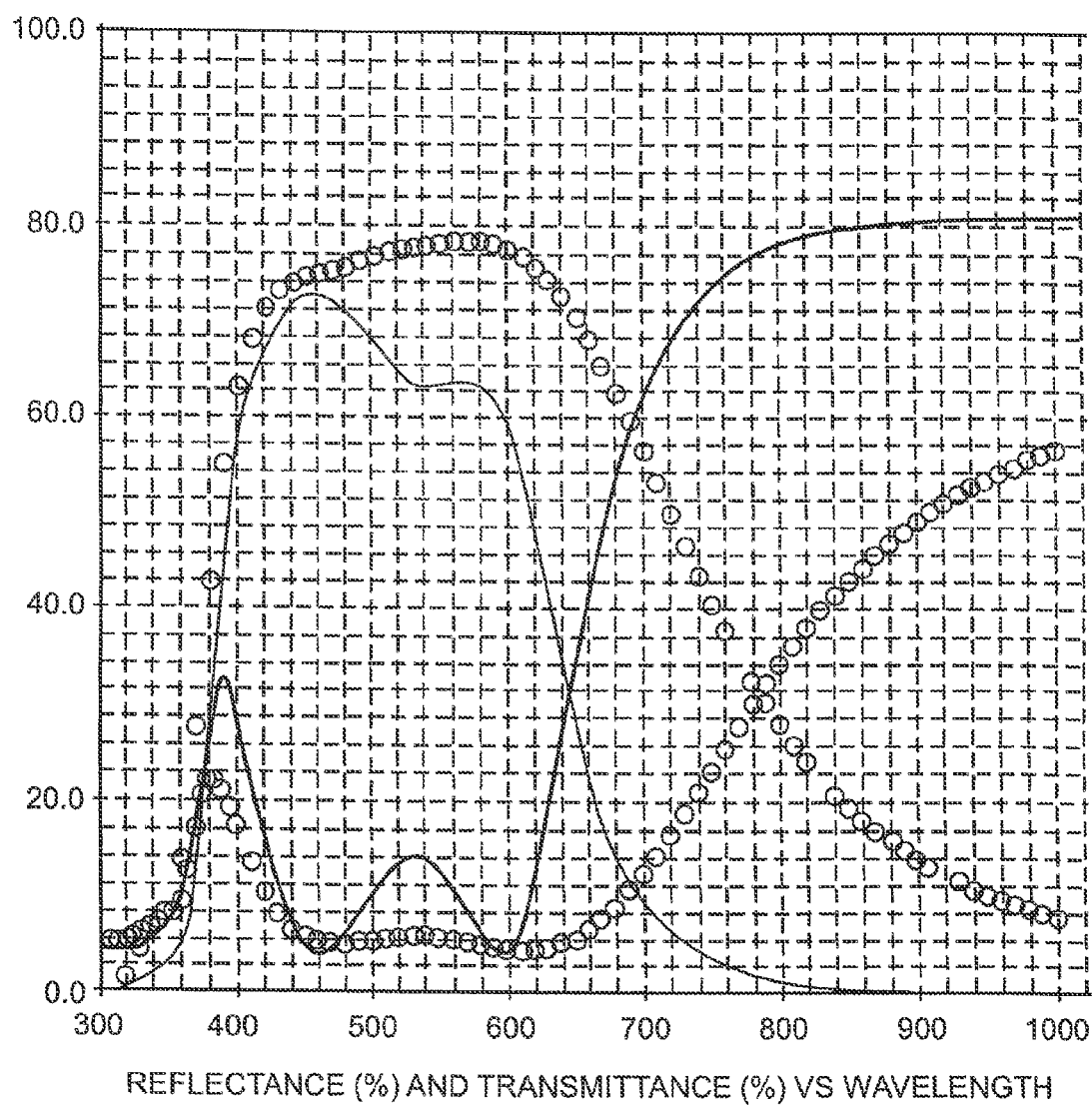
FIG. 3 is a graph comparing the spectral properties of a high infrared reflection coating in accordance with certain embodiments of the invention against a commercially available double silver low-emissivity coating.

The solar infrared reflection of the present coating 7 is much higher than that of the double silver coating. This is perhaps best appreciated by referring to FIG. 3, which is a graph showing both the spectral properties of the high infrared reflection coating 7 and those of the double silver coating. Here, a side-by-side comparison can be made of the solar infrared reflection levels achieved by these two coatings. It can be seen that the present coating 7 achieves a much higher infrared reflection than the double silver coating. It can also be seen that the levels of visible transmission for these two coatings are comparable. Moreover, the cutoff between visible wavelengths and infrared wavelengths is much sharper for the present coating 7 (the curves delineated with solid lines) than for the double silver coating (the curves delineated with circles). Thus, the high infrared reflection coating 7 provides a quantum leap forward in terms of energy efficiency compared to double silver low-emissivity coatings, and even more so compared to single silver low-emissivity coatings.

The present high infrared reflection coating (or "multiple cavity low-emissivity coating") 7 has a number of beneficial properties. The ensuing discussion reports several of these properties. In some cases, properties are reported herein for a single (i.e., monolithic) pane 12 bearing the present coating 7 on one surface 18. In other cases, these properties are reported for an IG unit 3 having the present coating 7 on its #2 surface 18. In such cases, the reported properties are for an IG unit wherein both panes are clear 2.2 mm soda lime float glass with a ½ inch between-pane space filled with an insulative gas mix of 90% argon and 10% air. Of course, these specifics are by no means limiting to the invention. Absent an express statement to the contrary, the present discussion reports determinations made using the well known WINDOW 5.2a computer program (e.g., calculating center of glass data) under standard ASHRAE conditions.

As noted above, the high infrared reflection coating 7 provides exceptional thermal insulating properties. The coating 7 comprises three infrared-reflection film regions 100, 200, and 300. These film regions are typically silver or another electrically conductive material, and they impart exceptionally low sheet resistance in the coating. For example, the sheet resistance of the present coating 7 is less than 3.0 Ω/square. Preferably, the sheet resistance of this coating 7 is less than 2.5 Ω/square (e.g., less than 2.0 Ω/square, less than 1.75 Ω/square, less than 1.5 Ω/square, or even less than 1.35 Ω/square). While the desired level of sheet resistance can be selected and varied to accommodate different applications, a number of preferred coating embodiments (e.g., the exemplary film stacks tabulated below) provide a sheet resistance of less than 1.4 Ω/square, such as about 1.25-1.3 Ω/square. The sheet resistance of the coating can be measured in standard fashion using a 4-point probe. Other methods known in the art as being useful for calculating sheet resistance can also be used.

The coating 7 also has exceptionally low emissivity. For example, the emissivity of the coating 7 is less than 0.06. Preferably, the emissivity of this coating 7 is less than 0.04 (e.g., less than 0.03, or even less than 0.025). While the desired level of emissivity can be selected and varied to accommodate different applications, a number of preferred coating embodiments (e.g., the exemplary film stacks tabulated below) provide an emissivity of less than 0.023, less than 0.022, or even less than 0.021. In one embodiment, the emissivity is about 0.020. In contrast, an uncoated pane of clear glass would typically have an emissivity of about 0.84.

The term "emissivity" is well known in the present art. This term is used herein in accordance with its well-known meaning to refer to the ratio of radiation emitted by a surface to the radiation emitted by a blackbody at the same temperature. Emissivity is a characteristic of both absorption and reflectance. It is usually represented by the formula: E=1−Reflectance. The present emissivity values can be determined as specified in "Standard Test Method For Emittance Of Specular Surfaces Using Spectrometric Measurements" NFRC 301-93, the entire teachings of which are incorporated herein by reference. Emissivity can be calculated by multiplying the measured sheet resistance by 0.016866. Using this method, a coating 7 that provides sheet resistance of about 1.25 can be found to have an emissivity of about 0.021.

In addition to low sheet resistance and low emissivity, the present coating 7 provides exceptional solar heat gain properties. As is well known, the solar heat gain coefficient (SHGC) of a window is the fraction of incident solar radiation that is admitted through a window. There are a number of applications where low solar heat gain windows are of particular benefit. In warm climates, for example, it is especially desirable to have low solar heat gain windows. For example, solar heat gain coefficients of about 0.4 and below are generally recommended for buildings in the southern United States. Further, windows that are exposed to a lot of undesirable sun benefit from having a low solar heat gain coefficient. Windows on the east or west side of a building, for instance, tend to get a lot of sun in the morning and afternoon. For applications like these, the solar heat gain coefficient plays a vital role in maintaining a comfortable environment within the building. Thus, it is particularly beneficial to provide windows of this nature with coatings that establish a low solar heat gain coefficient (i.e., low solar heat gain coatings). Low solar heat gain coatings would, in fact, be highly desirable for many window applications. However, these coatings have not traditionally offered high enough visible transmission to be more broadly adopted.

A tradeoff is sometimes made in low solar heat gain coatings whereby the films selected to achieve a low SHGC have the effect of decreasing the visible transmittance to a lower level than is ideal and/or increasing the visible reflectance to a higher level than is ideal. As a consequence, windows bearing these coatings may have unacceptably low visible transmission and/or a somewhat mirror-like appearance.

The present coating 7 provides an exceptionally low solar heat gain coefficient. For example, the solar heat gain coefficient of the present IG unit 3 is less than 0.4. Preferably, the present IG unit 3 has a solar heat gain coefficient of less than 0.35 (e.g., less than 0.33, or less than 0.31), less than 0.29, or even less than 0.28 (such as 0.27 or less). While the desired SHGC level can be selected and varied to accommodate different applications, some preferred embodiments (e.g., where the coating 7 is one of the exemplary film stacks tabulated below) provide an IG unit 3 having a solar heat gain coefficient of between 0.25 and 0.29 (e.g., between 0.25 and 0.28, such as 0.27). The present coating 7 can provide a SHGC within any one or more of these ranges while at the same time providing exceptional color (e.g., any color range noted below) and/or high visible transmission (e.g., any visible transmission range noted below). In some cases, the coating 7 provides this balance of properties while having a surprisingly high metal/dielectric ratio, as described below.

The term "solar heat gain coefficient" is used herein in accordance with its well known meaning. Reference is made to NFRC 200-93 (1993), the entire teachings of which are incorporated herein by reference. The SHGC can be calculated using the methodology embedded in the well known WINDOW 5.2a computer program.

In combination with the beneficial thermal insulating properties discussed above, the present coating 7 has exceptional optical properties. As noted above, a tradeoff is sometimes made in low solar heat gain coatings whereby the films selected to achieve good thermal insulating properties have the effect of restricting the visible transmission to a level that is lower than ideal.

To the contrary, the present coating 7 provides an exceptional combination of total visible transmission and thermal insulating properties. For example, the present IG unit 3 (and the present pane 12, whether monolithic or as part of the IG unit 3) has a visible transmittance $T_v$ of greater than 0.45 (i.e., greater than 45%). Preferably, the present IG unit 3 (and the present pane 12, whether monolithic or insulated) achieves a visible transmittance $T_v$ of greater than 0.55 (e.g., greater than 0.6), greater than 0.63, greater than 0.65, or even greater than 0.72.

While the desired level of visible transmittance can be selected and varied to accommodate different applications, certain preferred embodiments (e.g., where the coating 7 is one of the exemplary film stacks tabulated below) provide an IG unit 3 (or a pane 12, which can be monolithic or part of the IG unit 3) having a visible transmittance of greater than 0.65, such as about 0.66.

In one particular group of embodiments, the film region thicknesses and compositions are selected to achieve a visible transmittance of greater than 0.7, greater than 0.71, or even greater than 0.72. In some cases, the film region thicknesses and compositions are selected to achieve a visible transmittance of about 0.73. Here, the infrared-reflection film regions can optionally be thinned to provide the desired transmittance. Additionally or alternatively, the coating 7 can be provided with blocker layers that are deposited as dielectric films (such as oxide, nitride, and/or oxynitride films) throughout their thickness (rather than having an innermost metal portion). Here, the coating 7 desirably provides a visible transmittance within any one or more of the ranges noted in this paragraph (or the previous paragraph) in combination with having a minimum combined thickness for the three infrared-reflective film regions within any one or more of the ranges described below and/or in combination with any one or more of the minimums noted below for the metal/dielectric ratio.

The use of suboxide protective layers having reduced absorption (e.g., $TiO_x$, where x is less than 2) could even boost the transmission to greater than 0.80.

The term "visible transmittance" is well known in the art and is used herein in accordance with its well-known meaning. Visible transmittance, as well as visible reflectance, can be determined in accordance with NFRC 300, Standard Test Method for Determining the Solar and Infrared Optical Properties of Glazing Materials and Fading Resistance of Systems (National Fenestration Rating Council Incorporated, adopted December 2001, published January 2002). The well known WINDOW 5.2a computer program can be used in calculating these and other reported optical properties.

Preferably, the coated substrate (i.e., the present pane) 12 has a spectral transmission curve with a peak transmission located in the visible wavelength range. This is readily apparent in FIG. 2. In certain embodiments, this spectral transmission curve has a halfwidth of less than 360 nm, less than 320 nm, less than 310 nm, less than 305 nm, less than 300 nm, less than 290 nm, less than 280 nm, less than 275 nm, less than 265 nm, or even less than 250 nm. In these embodiments, the coating 7 provides a highly advantageous narrow transmission curve, which desirably has high visible transmittance spanning the visible range and, at the same time, provides an exceptionally steep slope between highly transmitted visible wavelengths and highly reflected infrared wavelengths. In certain embodiments, the coating 7 additionally (i.e., together with having any maximum halfwidth noted above) or alternatively achieves a halfwidth that is greater than 50 nm, greater than 100 nm, greater than 150 nm, or even greater than 175 nm. This can be desirable in providing high levels of visible transmittance over a substantial portion of the visible spectrum.

The present coating 7 provides exceptional efficiency in terms of the low solar heat gain coefficient that is achieved in combination with high visible transmission. The ratio of visible transmittance (as a fraction of unity) over SHGC is referred to herein as the visible-thermal efficiency ratio of the present IG unit 3. This ratio preferably is greater than 2, greater than 2.2, or even greater than 2.3. In some preferred embodiments, this ratio is greater than 2.33, greater than 2.34, greater than 2.37, greater than 2.4, greater than 2.42, or even greater than 2.43. In some embodiments, this ratio is about 2.37. In other embodiments, this ratio is about 2.44. Certain preferred embodiments (e.g., where the coating 7 is one of the exemplary film stacks tabulated below) provide an IG unit 3 having a visible-thermal efficiency ratio of greater than 2.0 but less than 2.5 (e.g., about 2.4-2.5), such as about 2.44.

Another useful parameter to consider is $T_{740}$, i.e., the transmittance at 740 nm. The present coating 7 can provide a particularly low $T_{740}$, while at the same time providing high levels of visible transmittance and good color properties. For example, the present pane 12 preferably has a $T_{740}$ of less than 0.30, or even less than 0.20. Perhaps more preferably, the present pane 12 (when monolithic, or when part of an insulating unit) has a $T_{740}$ of less than 0.15 (e.g., less than 0.1, less than 0.07, less than 0.06, or even less than 0.05). While the desired level of transmittance at 740 nm can be selected and varied to accommodate different applications, certain preferred embodiments (e.g., where the coating 7 is one of the exemplary film stacks tabulated below) provide a coated pane 12 (which can be monolithic or part of the IG unit 3) having a $T_{740}$ of about 0.04.

The present coating 7 can achieve color properties that are exceptional, particularly given the high level of thermal insulation it facilitates. The coating 7 is extremely well suited for applications in which reflected color is of concern. The following discussion of color is reported using the well known color coordinates of "a" and "b". In particular, these color coordinates are indicated herein using the subscript h (i.e., $a_h$ and $b_h$) to represent the conventional use of the well known Hunter Lab Color System (Hunter methods/units, Ill. D65, 10 degree observer). The present color properties can be determined as specified in ASTM Method E 308, the entire teachings of which are incorporated herein by reference.

The present IG unit has an exceptionally neutral (i.e., colorless) appearance in reflection, with any appreciable color being of a pleasing hue. The reflected color reported herein is as viewed from the exterior of the present IG unit (i.e., off the #1 surface side of the outboard pane). In some embodiments, the present IG unit exhibits a reflected color characterized by an $a_h$ color coordinate of between about +1.5 and about −2 and a $b_h$ color coordinate of between about 0 and about −3. These embodiments represent a broader embodiment group wherein (whether or not the $a_h$ and $b_h$ are within the ranges noted above) the present IG unit has an exterior reflected color characterized by a chroma magnitude number (defined as the square root of $[a_h^2+b_h^2]$) of less than about 3.6. It is a commonly stated goal for coatings to achieve a color neutral appearance. With coatings having three or more infrared-reflection film regions, however, this becomes a more difficult pursuit, and the difficulty tends to increase with greater total metal thickness. Moreover, the color properties achieved by the present coatings are particularly surprising given the metal/dielectric ratios used in certain embodiments disclosed herein.

Preferably, the magnitude of at least one of the $a_h$ and $b_h$ coordinates is negative (in some embodiments, both are negative). In certain embodiments, at least one these color coordinates (e.g., $b_h$) is significantly away (e.g., by at least 0.25, at least 0.3, or at least 0.5 in magnitude) from the vertical and/or horizontal axes of the color space (i.e., away from the "zero" coordinates). As one approaches the vertical and/or horizontal axes of the color space, a small change in the magnitude of $a_h$ or $b_h$ may translate into a considerable change in terms of actual appearance, the less desirable yellow or red zones being thereby encroached.

The present coating 7 can achieve a reflected color that is exceptional in actual appearance. In certain preferred embodiments (e.g., where the coating 7 is one of the exemplary film stacks tabulated or detailed below), the IG unit exhibits a reflected color characterized by an $a_h$ color coordinate of between about +1 and about −1 (e.g., between about 0 and about −0.5) and a $b_h$ color coordinate of between about −0.5 and about −2.5 (e.g., between about −1.5 and about −1.75). These embodiments represent a broader group of embodiments wherein (whether or not $a_h$ and $b_h$ are within the noted ranges) the present IG unit has an exterior reflected color characterized by a chroma magnitude number of less than about 2.7, such as less than about 1.82. The desirability of these color properties on a qualitative level (in terms of the appearance of a window bearing this coating) is best appreciated by viewing an IG unit bearing the present coating 7 in comparison to IG units bearing other coatings that have comparable total amounts of infrared-reflection film.

The present IG unit also exhibits a pleasing transmitted color. Preferably, the IG unit exhibits a transmitted color characterized by an $a_h$ color coordinate of between about −3.5 and about −6 and a $b_h$ color coordinate of between about +2.25 and about +4.5. In certain preferred embodiments (e.g., where the coating is one of the preferred film stacks tabulated or detailed below), the IG unit exhibits a transmitted color characterized by an $a_h$ color coordinate of between about −4 and about −5.5 (e.g., between about −4.5 and about −5) and a $b_h$ color coordinate of between about +2.5 and about +4.25 (e.g., between about +3 and about +3.5). These embodiments represent a broader embodiment group wherein the magnitude of at least one of the $a_h$ and $b_h$ coordinates is negative for transmitted color.

Figure 4:
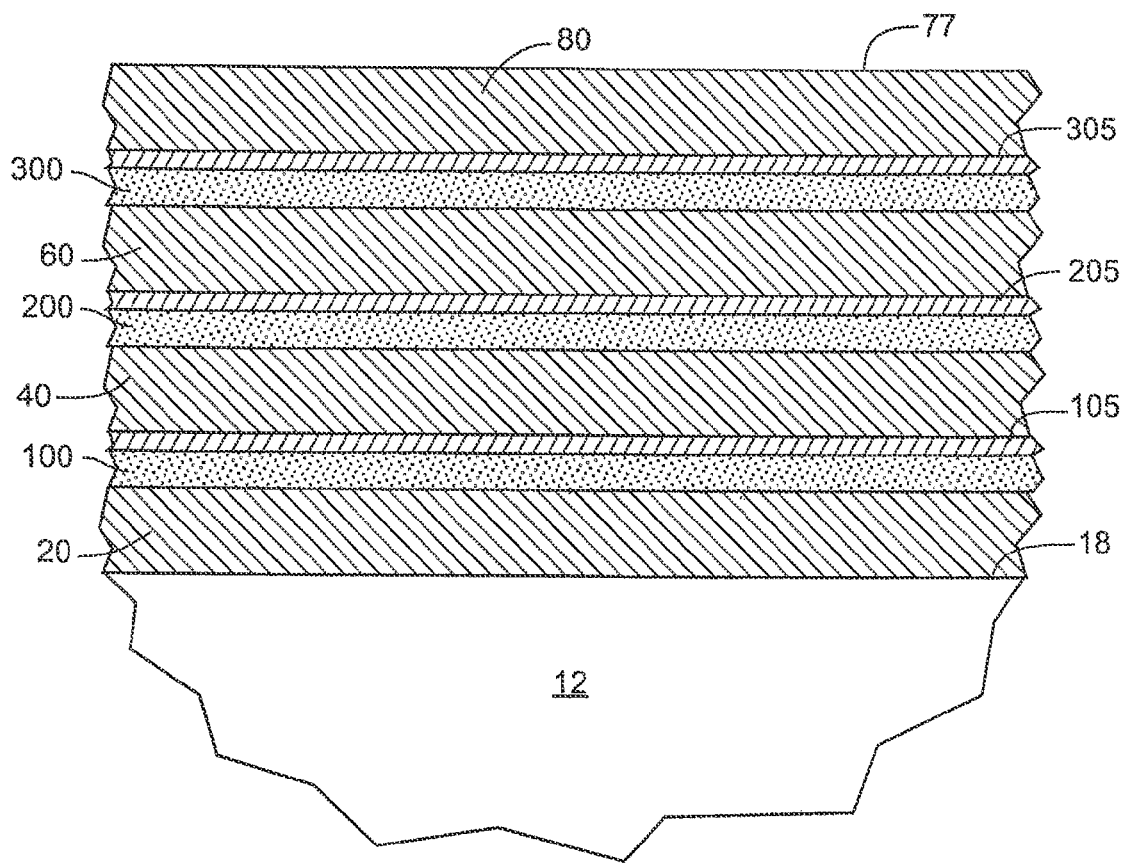
FIG. 4 is a schematic cross-sectional side view of a substrate bearing a high infrared reflection coating in accordance with certain embodiments of the invention.

FIG. 4 exemplifies certain embodiments that provide a coated substrate 12 having a major surface 18 bearing a low-emissivity coating 7. The coating includes, in sequence from the major surface 18 outwardly, a first transparent dielectric film region 20, a first infrared-reflection film region 100, a second transparent dielectric film region 40, a second infrared-reflection film region 200, a third transparent dielectric film region 60, a third infrared-reflection film region 300, and a fourth transparent dielectric film region 80. In FIG. 4, optional blocker film regions 105, 205, 305 are shown, although these are not required in all embodiments. Also, blocker film regions or nucleation layers can optionally be provided beneath the infrared-reflection film regions.

A variety of substrates are suitable for use in the present invention. In most cases, the substrate 12 is a sheet of transparent material (i.e., a transparent sheet). However, the substrate 12 is not required to be transparent. For example, opaque substrates may be useful in some cases. It is anticipated, however, that for most applications, the substrate will comprise a transparent or translucent material, such as glass or clear plastic. In many cases, the substrate 10 will be a glass pane. A variety of glass types can be used, and soda-lime glass is expected to be preferred.

Substrates of various sizes can be used in the present invention. Commonly, large-area substrates are used. Certain embodiments involve a substrate 12 having a major dimension (e.g., a width or length) of at least about 0.5 meter, preferably at least about 1 meter, perhaps more preferably at least about 1.5 meters (e.g., between about 2 meters and about 4 meters), and in some cases greater than 2 meters or at least about 3 meters.

Substrates of various thicknesses can be used in the present invention. Commonly, substrates with a thickness of about 1-5 mm are used. Some embodiments involve a substrate 10 with a thickness of between about 2.3 mm and about 4.8 mm, and perhaps more preferably between about 2.5 mm and about 4.8 mm. In some cases, a sheet of glass (e.g., soda-lime glass) with a thickness of about 3 mm is used.

The present coating includes at least two optical cavities. For purposes of the present disclosure, the term "cavity" is defined to mean the region (which is occupied by film) between two adjacent infrared-reflection film regions. In some of the present embodiments, the coating has only two cavities. In other embodiments, the coating has three or more cavities. In some of the both embodiment types, each of the cavities has a thickness of between about 300 Å and about 850 Å, and perhaps more preferably between about 400 Å and about 750 Å.

Some embodiments of the invention provide a metal/dielectric ratio that has surprisingly been found to give exceptional results. Here, the "metal/dielectric ratio" is the total thickness of all the infrared-reflection film regions (in embodiments involving silver, the total silver thickness) divided by the total thickness of the transparent dielectric film regions (not counting any metallic blocker layers that may be present). In the present embodiments, the metal/dielectric ratio preferably is at least 0.2, at least 0.22, at least 0.25, at least 0.26, or even at least 0.27. Tabulated below are exemplary embodiments wherein this ratio is between about 0.27 and about 0.28.

Each infrared-reflection film region 100, 200, 300 can advantageously comprise (optionally at least 50 atomic percent of, in some cases consisting essentially of) silver. Further, in some embodiments, the thickness of at least one of the infrared-reflection film regions 100, 200, 300 is greater than 150 angstroms, greater than 175 angstroms, or even greater than 200 angstroms. Additionally or alternatively, the first, second, and third infrared-reflection film regions can optionally have a combined thickness of greater than 425 Å, greater than 450 Å, greater than 460 Å, greater than 470 Å, greater than 475 Å, or even greater than 485 Å. In one embodiment, this combined thicknesses is about 477 Å. For example, in some cases, the first, second, and third infrared-reflection film regions 100, 200, 300 are silver layers having respective thicknesses of 122 Å, 149 Å, and 206 Å. In another embodiment, the combined thicknesses is about 492 Å. For example, in some cases, the first, second, and third infrared-reflection film regions 100, 200, 300 are silver layers having respective thicknesses of 128 Å, 157 Å, and 207 Å.

Certain embodiments provide the second and third infrared-reflection film regions (each of which can optionally be a layer, such as a discrete layer of silver) at a combined thickness of at least 325 Å, at least 335 Å, at least 340 Å, at least 350 Å, or even at least 355 Å. In some embodiments, this combined thickness is 355-395 Å. Here, a relatively large amount of reflective film (e.g., silver) is concentrated at the outer portions of the coating, with the goal of this having a particularly great lowering of emissivity while at the same time facilitating particularly good color, visible transmission, and visible reflection properties. Additionally or alternatively, at least one of the infrared-reflection film regions can be thicker than at least one of the other infrared-reflection film regions by at least 50 Å, at least 75 Å, or at least 80 Å. In some preferred embodiments of this nature, it is the third infrared-reflection film region that is thicker than the first infrared-reflection film region, by one or more of the noted amounts.

Some embodiments provide an arrangement wherein the second infrared-reflection film region is thicker than the first infrared-reflection film region by at least 10 Å, at least 20 Å, at least 25 Å, or even at least 30 Å. Additionally or alternatively, the third infrared-reflection film region can be thicker than the second infrared-reflection film region by at least 25 Å, at least 35 Å, at least 40 Å, or even at least 50 Å.

Thus, certain embodiments provide a third infrared-reflection film region at a greater thickness than a second infrared-reflection film region, while the second infrared-reflection film region has a greater thickness than a first infrared-reflection film region. Related methods involve a first power level being used to sputter a silver-containing target in depositing the first infrared-reflective film region, a second power level being used to sputter a silver-containing target in depositing the second infrared-reflective film region, and a third power level being used to sputter a silver-containing target in depositing the third infrared-reflective film region. Here, the third power level can advantageously be greater than the second power level, while the second power level is greater than the first power level.

One group of embodiments provides a coated substrate (e.g., a coated pane, such as a glass pane, optionally having a major dimension of at least 1 meter, or at least 1.2 meters) bearing a low-emissivity coating 7 that comprises three infrared-reflection film regions 100, 200, 300 having a combined thickness of between 420 Å and 575 Å, optionally in combination with a metal/dielectric ratio within one or more of the ranges described above.

The infrared-reflection film regions 100, 200, 300 are described below in further detail. Briefly, though, some preferred embodiments provide these film regions in the form of silver layers each comprising (optionally consisting essentially of) silver, with these three layers optionally being the only silver-containing layers in the coating.

To optimize the conductivity and crystallinity of the metal (e.g., Ag) films, a surface treatment can optionally be applied to improve the properties (e.g., surface energy) of the growth control layer.

Three silver-containing layers can optionally each have a thickness of between about 50 Å and about 300 Å. Preferably, though, they each have a thickness of between about 75 Å and about 275 Å, and perhaps more preferably between about 100 Å and about 250 Å. In one embodiment of this nature, the substrate 12 is a glass sheet having a major dimension of at least one meter (or at least 1.2 meters, optionally greater than 2 meters), and this glass sheet is part of a multiple-pane insulating glass unit that includes at least one other glass sheet, where the multiple-pane unit has a between-pane space 1500, which can optionally be evacuated, filled with air, or filled with air and insulative gas (e.g., argon).

With respect to the four transparent dielectric film regions 20, 40, 60, 80, in certain embodiments, each of these film regions has a total physical thickness of between about 50 Å and about 900 Å, and perhaps more preferably between about 100 Å and about 800 Å. These dielectric film regions are described below in more detail.

The first transparent dielectric film region 20 is applied over (in some cases, directly over) a major surface 18 of the substrate 12. This film region 20 can be of any composition that includes at least some (or, optionally, consists essentially of) transparent dielectric film. In some cases, the first transparent dielectric film region 20 is a single layer. In other cases, it comprises a plurality of layers. As described in U.S. Pat. No. 5,296,302 (the teachings of which concerning useful dielectric materials are incorporated herein by reference), useful dielectric film materials for this purpose include oxides of zinc, tin, indium, bismuth, titanium, hafnium, zirconium, and alloys thereof. Film comprising silicon nitride and/or silicon oxynitride is also used in some embodiments. The film region 20 can optionally include one or more absorbing dielectric and/or metal films, such as to control shading, color, or other optical properties.

The first transparent dielectric film region 20 can be a single layer of a single dielectric material. If a single layer is used, it is generally preferred that this inner dielectric layer be formed of a mixture of zinc oxide and tin oxide (referred to below, e.g., in Table 1, as "Zn+O"). It should be understood, though, that such a single layer can be replaced with two or more layers of different dielectric materials.

In certain embodiments, each of the first, second, and third (counting from substrate) dielectric regions (or "optical cavities") comprises an uppermost (i.e., further from the substrate) oxide layer in contact with a Ag layer, and such uppermost layer has a composition of Zn+ where plus denominates a concentration x by weight of a desired metal like: Sn, In, Ni, Cr, Mo with 0<X<0.3. This refers to the ratio of the weight, on a metal-only basis, of the desired metal over the total weight of all metals in the Zn+ film (in some cases, this ratio is the Sn weight divided by the total weight of Sn and Zn, such as where the layer is zinc tin oxide). Such a top layer has preferentially a thickness of at least 2.5 nm and less than 5.0 nm. The remainder of the cavity layer, in some cases, comprises film having higher refractive index, such as titania (e.g., $TiO_2$) or niobium oxide.

In certain embodiments, the first transparent dielectric film region 20 comprises a graded thickness of film, having a composition that changes (e.g., in a gradual manner) with increasing distance from the substrate 12.

In some particular embodiments, the first transparent dielectric film region 20 comprises film (optionally comprising zinc oxide, such as a zinc tin oxide) having a refractive index of 1.7 or greater. For example, between the first infrared-reflection film region 100 and the surface 18 of the substrate 12, there can advantageously be provided a desired total thickness of film that has a refractive index of 1.7 or greater. In some cases, this desired total thickness is less than 195 angstroms, less than 190 angstroms, less than 175 angstroms, less than 165 angstroms, less than 145 angstroms, or even less than 140 angstroms. Some related method embodiments involve depositing no more than 175 angstroms of transparent dielectric film between a first infrared-reflection film region 100 and a top major surface of a glass sheet.

Referring again to FIG. 4, the first infrared-reflection film region is identified by the reference number 100. This film region 100 preferably is contiguous to, i.e., in direct physical contact with, the outer face of the first transparent dielectric film region 20. Any suitable infrared reflection material can be used. Silver, gold, and copper, as well as alloys thereof, are the most commonly used infrared-reflection film materials. Preferably, the infrared-reflection film consists essentially of silver or silver combined with no more than about 5% of another metal, such as another metal selected from the group consisting of nickel, molybdenum, tantalum, platinum, and palladium. This, however, is by no means required.

When desired for protection of the infrared-reflection film during application of subsequent film and/or during any heat treatment (e.g., tempering), a first blocker film region 105 can optionally be provided over and contiguous to the first infrared-reflection film region 100. This blocker film region 105 can be provided to protect the underlying infrared-reflection film region 100 from plasma chemical attack. In such cases, any material that is readily oxidized may be useful. In certain embodiments, a thin layer of titanium metal is applied, and in some cases (e.g., cases where oxide film is reactively deposited directly over such a blocker film region) at least an outermost thickness of that titanium metal is converted to titanium oxide of varying stoichiometry during deposition of overlying film. In another embodiment, the blocker film region 105 is deposited as a layer of niobium. Useful blocker layers comprising niobium are discussed in detail in PCT International Publication No. WO 97/48649. The teachings of this PCT Publication relating to blocker layers are incorporated herein by reference. In other embodiments, the blocker film region 105 can comprise a material selected from the group consisting of nickel, chromium, zinc, tin, aluminum, indium, and zirconium.

In some embodiments, a high transmission blocker layer material (e.g., a dielectric material, optionally as deposited) is used for one or more (optionally for each of the) blocker film regions 105, 205, 305. The material used, for example, can be an oxide, nitride, or oxynitride. This material can advantageously be sputtered from a ceramic target either in an inert atmosphere, a nitriding atmosphere, or a slightly oxidizing atmosphere. In some embodiments, a substoichiometric sputterable target material is used. For example, the target material can optionally comprise substoichiometric titania, $TiO_x$, where x is less than 2. Alternatively, a ZnAlO target may be used. In still other embodiments, a ceramic target comprising titanium, silicon, and oxygen is used. If so desired, a very thin metal film (e.g., less than 25 Å, less than 20 Å, less than 15 Å, less than 10 Å, less than 9 Å, or even less than 8 Å) can be applied directly over the infrared-reflection film, and directly over this thin metal film there can be applied a dielectric blocker film region (which optionally has a thickness of less than 50 Å, less than 40 Å, less than 30 Å, less than 25 Å, less than 20 Å, or even less than 15 Å). When provided, the very thin metal film can, for example, be deposited as a metallic film comprising titanium, niobium, nickel, chromium, nickel-chrome, zinc, tin, zinc-tin, aluminum, indium, zirconium, or a combination including at least one of these materials together with one or more other metallic materials. In these embodiments, the thin metal film desirably is deposited in an inert atmosphere and the dielectric blocker film region can be deposited either in an inert or reactive atmosphere. For example, when sputtering is used, a ceramic target can be sputtered in an inert or slightly reactive atmosphere, or a metal target can be sputtered in a reactive atmosphere.

In one particular group of embodiments, the coating 7 comprises three infrared-reflection film regions directly over at least one of which (and optionally over each of which) there is provided a blocker film region that is deposited in a non-metallic form (e.g., as a non-metallic material selected from the group consisting of an oxide, a nitride, and an oxynitride, including substoichiometric forms thereof). In this group of embodiments, the thickness of each such blocker film region can be within any one of the ranges noted herein for the optional blocker film regions, such as less than 50 Å. In some cases, the optional blocker film region has a thickness in the range of 3-35 Å, 3-25 Å, or 3-18 Å.

In certain embodiments, the first blocker film region 105 has a particularly small thickness, such as less than 25 Å, less than 20 Å, less than 15 Å, less than 10 Å, less than 7 Å, less than 6 Å, or even less than 5 Å. While not shown in FIG. 4, a blocker film region can optionally be provided under the first infrared-reflection film region 100 as well.

In certain embodiments, the blocker regions can comprise two or more sublayers. In some cases, a first sublayer is provided directly contacting the infrared-reflection film and a second sublayer provided directly over the first sub-layer. The first sublayer can be a material reacted to a less degree (e.g., sputtered metal layer) and the second sublayer can be a material reacted to a higher degree (e.g., a substoichiometric layer). The second sub-layer can have less absorption than the material of the first sub-layer. Such an arrangement can help to keep the optical absorption low and also helps to prevent the sheet resistance of the infrared-reflective film from increasing. In such cases, the combined thickness of the sublayers can be up to 100 Å.

The second transparent dielectric film region 40 is positioned between the first infrared-reflection film region 100 and the second infrared-reflection film region 200 (the area between these two film regions 100, 200 being referred to herein as the "first cavity"). The film region 40 can be referred to as a first "spacer" film region, which is located in the first cavity. This first spacer film region 40 can be a single layer of a single transparent dielectric material, or it can be a plurality of layers of different transparent dielectric materials. In some cases, the second transparent dielectric film region 40 comprises at least three transparent dielectric layers. Optionally, there are at least five, or even at least seven, such layers. As an alternative to using one or more discrete layers, part or all of the second transparent dielectric film region 40 can have a graded composition (optionally characterized by a gradual transition from one transparent dielectric material to another with increasing distance from the substrate). The film region 40 can optionally include one or more absorbing dielectric and/or metal films, such as to control shading, color, or other optical properties.

The next illustrated film region is the second infrared-reflection film region 200. This film region 200 preferably is contiguous to the outer face of the second transparent dielectric film region 40. Any suitable infrared reflection material can be used, such as silver, gold, and copper, or alloys including one or more of these metals. In some particular embodiments, the infrared-reflection film consists essentially of silver or silver combined with no more than about 5% of another metal, such as another metal selected from the group consisting of gold, platinum, and palladium.

When desired for protection of the second infrared-reflection film region 200, a second blocker film region 205 can optionally be provided over and contiguous to the second infrared-reflection film region 200. This blocker film region 205, for example, can comprise any material that is readily oxidized. In certain embodiments, a thin layer of titanium metal is applied, and in some cases (e.g., cases where oxide film is reactively deposited directly over this blocker film region 205) at least an outermost thickness of that titanium metal is converted to a titanium oxide of varying stoichiometry during deposition of overlying film. In other cases, the blocker film region 205 can comprise a material selected from the group consisting of nickel, chromium, zinc, tin, aluminum, indium, and zirconium. In another embodiment, the blocker film region 205 is deposited as a layer of niobium or one of the non-metallic blocker film materials discussed above. The blocker film region 205, for example, can optionally comprise the above-noted arrangement of: a very thin metal film directly over film region 200, and; a dielectric film directly over this very thin metal film. Alternatively, the dielectric film can be deposited directly over film region 200.

Suitable thicknesses for the optional second blocker film region 205 generally range from 3-35 Å, 3-25 Å, or 3-18 Å. In certain embodiments, the second blocker film region 205 has a particularly small thickness, such as less than 25 Å, less than 20 Å, less than 15 Å, less than 10 Å, less than 7 Å, less than 6 Å, or even less than 5 Å. While not shown in FIG. 4, a blocker film region can optionally be provided under the second infrared-reflection film region 200.

The third transparent dielectric film region 60 is positioned between the second infrared-reflection film region 200 and the third infrared-reflection film region 300. This transparent dielectric film region 60 is also a spacer film region (it is located within the "second cavity"), and can be referred to as the second spacer film region. The third transparent dielectric film region 60 can be a single layer of a single transparent dielectric material, or it can be a plurality of layers of different transparent dielectric materials. In some cases, the third transparent dielectric film region 60 comprises at least three transparent dielectric layers. Optionally, there are at least five, or even at least seven, such layers. As an alternative to one or more discrete layers, part or all of the third transparent dielectric film region 60 can have a graded composition. The film region 60 can optionally include one or more absorbing dielectric (TiN, Ti oxy nitrides, etc.) and/or metal films, such as to control shading, color, or other optical properties.

The next illustrated film region is the third infrared-reflection film region 300. This film region 300 preferably is contiguous to the outer face of the third transparent dielectric film region 60. Any suitable infrared reflection material can be used (e.g., silver, gold, copper, or an alloy comprising one or more of these metals). In some particular embodiments, the third infrared-reflection film region 300 consists essentially of silver or silver combined with no more than about 5% of another metal, such as another metal selected from the group consisting of gold, platinum, and palladium.

When desired for protection of the third infrared-reflection film region 300, a third blocker film region 305 can optionally be provided over and contiguous to the third infrared-reflection film region 300. This blocker film region 305, for example, can comprise any material that is readily oxidized. In certain embodiments, a thin layer of titanium metal is applied, and in some cases (e.g., cases where oxide film is reactively deposited directly over this blocker film region 305) at least an outermost thickness of that titanium metal is converted to a titanium oxide of varying stoichiometry during deposition of overlying film. In other cases, the blocker film region 305 can comprise a material selected from the group consisting of nickel, chromium, zinc, tin, aluminum, indium, and zirconium. In another embodiment, the blocker film region 305 is deposited as a layer of niobium or one of the non-metallic blocker film materials described above. The blocker film region 305, for example, can optionally comprise the above-noted arrangement of: a very thin metal film directly over film region 300, and; a dielectric film directly over this very thin metal film. Alternatively, the dielectric film can be deposited directly over the film region 300.

Suitable thicknesses for the optional third blocker film region 305 generally range from 3-35 Å, 3-25 Å, or 3-18 Å. In certain embodiments, the third blocker film region 305 has a particularly small thickness, such as less than 25 Å, less than 20 Å, less than 15 Å, less than 10 Å, less than 7 Å, less than 6 Å, or even less than 5 Å. While not shown in FIG. 4, a blocker film region can optionally be provided under the third infrared-reflection film region 300 as well.

Given the large number of blocker film regions provided in certain embodiments, it can be advantageous to use a very small thickness for one or more of the blocker film regions. Thus, in some embodiments, directly over at least one of the infrared-reflection film regions there is provided a blocker film region having a thickness of less than 20 Å, less than 15 Å, less than 7 Å, less than 6 Å, or even less than 5 Å. Further, in some embodiments, the coating 7 includes three blocker film regions 105, 205, 305, and the combined thickness of all three of these blocker film regions is less than less than 60 Å, less than 45 Å, less than 30 Å, less than 25 Å, less than 20 Å, less than 18 Å, or even less than 15 Å.

Moreover, certain embodiments provide the coating with a high combined thickness for the three infrared-reflection film regions (e.g., any combined thickness range noted herein) in combination with one or more (e.g., three) blocker film regions 105, 205, 305 of the dielectric or thin metal/dielectric type described above. These embodiments can provide an exceptional combination of good thermal insulating properties and high visible transmission.

The fourth transparent dielectric film region 80 (which may, though need not, be an outer coat) is located further from the substrate 12 than the third infrared-reflection film region 300. In some, though not all, embodiments, this film region 80 defines the coating's outermost face 77 (which face can optionally be exposed, i.e., not covered by any other film). The fourth transparent dielectric film region 80 can be a single layer of a single transparent dielectric material, or it can be a plurality of layers of different transparent dielectric materials. In some cases, the fourth transparent dielectric film region 80 comprises at least three transparent dielectric layers. Optionally, there are at least five, or even at least seven, such layers. As an alternative to using one or more discrete layers, part or all of the fourth transparent dielectric film region 80 can have a graded composition. The film region 80 can optionally include one or more absorbing dielectric and/or metal films, such as to control shading, color, or other optical properties.

Thus, it can be appreciated that the present coating 7 desirably includes at least four transparent dielectric film regions 20, 40, 60, 80. In some embodiments, the coating 7 comprises one or more, two (wherein optionally an infrared-reflection film region is located between, though not in contact with, such two nitride films) or more, or three or more nitride or oxynitride films, such as at least one, at least two, or at least three films comprising silicon nitride and/or silicon oxynitride. In some embodiments of this nature, the coating 7 includes at least one nitride or oxynitride film (optionally comprising silicon nitride and/or silicon oxynitride) having a thickness of less than 150 angstroms, less than 140 angstroms, or even less than 125 angstroms (this type of convention globally meaning greater than zero), together with at least one other nitride or oxynitride film (optionally comprising silicon nitride and/or silicon oxynitride) having a thickness of greater than 50 angstroms, greater than 75 angstroms, greater than 100 angstroms, greater than 150 angstroms, or even greater than 175 angstroms. In some cases, the latter noted film is located either between the first 100 and second 200 infrared-reflection film regions or between the second 200 and third 300 infrared-reflection film regions. That is, it forms (or is part of) one of the spacer film regions. Desirably, the outermost film of the coating 7 comprises silicon nitride, as described in the exemplary method detailed below. In one embodiment, the coating includes two nitride films: one in an outer coat formed by film region 80 and one in film region 60.

The total thickness of the present coating 7 can be varied to suit the requirements of different applications. In certain preferred embodiments, the total physical thickness of the coating 7 is greater than 1,750 angstroms, greater than 1,800 angstroms, greater than 1,900 angstroms, or even greater than 2,000 angstroms. For any embodiment disclosed in this specification, the coating's total thickness can optionally fall within any one or more of the ranges specified in this paragraph.

In one particular group of embodiments, the thickness of the third infrared-reflection film region 300 is greater than the thickness of the second infrared-reflection film region 200, and the thickness of the second infrared-reflection film region 200 is greater than the thickness of the first infrared-reflection film region 100. This group of embodiments is advantageous in terms of providing good reflected color properties. In one subgroup of these embodiments, the first 100, second 200, and third 300 infrared-reflection film regions each comprise (or consist essentially of) silver. Optionally, the coating 7 also has a metal/dielectric ratio within one or more of the ranges described above.

For purposes of the present specification, the first reflection-region ratio is defined as being the thickness of the first infrared-reflection film region 100 over the thickness of the second infrared-reflection film region 200, and the second reflection-region ratio is defined as being the thickness of the second infrared-reflection film region 200 over the thickness of the third infrared-reflection film region 300. In some particular embodiments, at least one of the first and second reflection-region ratios is less than 0.85, less than 0.83, or even less than 0.80. Optionally, the first and second reflection-region ratios are both less than 0.83, such as about 0.819 and 0.723 respectively.

In some embodiments of the present group, the thickness of at least one of the infrared-reflection film regions 100, 200, 300 is greater than 150 Å, greater than 175 Å, or even greater than 200 Å. Additionally or alternatively, the first, second, and third infrared-reflection film regions can optionally have a combined thickness of greater than 425 Å, greater than 450 Å, greater than 460 Å, greater than 475 Å, or even greater than 485 Å. In certain embodiments, this combined thickness is about 477 Å. For example, in some cases, the first, second, and third infrared-reflection film regions 100, 200, 300 are silver layers having respective thicknesses of 122 Å, 149 Å, and 206 Å. In other embodiments, the combined thickness is about 492 Å. For example, in some cases, the first, second, and third infrared-reflection film regions 100, 200, 300 are silver layers having respective thicknesses of 128 Å, 157 Å, and 207 Å.

In some embodiments of the present group, the first transparent dielectric film region 20 comprises film (optionally comprising zinc oxide, such as a zinc tin oxide) having a refractive index of 1.7 or greater. For example, between the first infrared-reflection film region 100 and the surface 18 of the substrate 12, there can advantageously be provided a desired total thickness of film that has a refractive index of 1.7 or greater. In certain embodiments, this desired total thickness is less than 195 angstroms, less than 190 angstroms, less than 175 angstroms, less than 165 angstroms, less than 145 angstroms, or even less than 140 angstroms.

For purposes of this disclosure, the primary dielectric-region ratio is defined as being the thickness of the first transparent dielectric film region 20 over the thickness of the fourth transparent dielectric film region 80. This ratio can advantageously be less than 0.75, or even less than 0.6, while at the same time optionally being greater than 0.34, greater than 0.35, greater than 0.37, or even greater than 0.40. In one exemplary embodiment, this ratio is about 0.47. A primary dielectric-region ratio within any one or more of these ranges can optionally be adopted for any embodiment of the present group, or for any other embodiment disclosed in this specification (e.g., in combination with one or more of the optional ranges noted for the metal/dielectric ratio).

Certain embodiments of the invention provide a particular ratio for the combined thickness of the first transparent dielectric film region 20 (which may be the base coat, i.e., the dielectric film region closest to the substrate) and the fourth transparent dielectric film region 80 (which may be the outer coat) divided by the combined thickness of the second 40 and third 60 transparent dielectric film regions (which may be the first and second spacer layers, respectively). In these embodiments, this ratio preferably is greater than about 0.43, greater than about 0.45, or even greater than about 0.475. Coatings having this arrangement of dielectric thickness have been found to facilitate excellent properties, including good color, high visible transmission, etc., even when large amounts of infrared-reflection film is used.

Table 1 below shows one exemplary film stack that can be used as the present coating 7:

TABLE 1

| FILM | STACK A |
| --- | --- |
| Glass | |
| TiO2 | 132 Å |
| Ag | 122 Å |
| Ti | 20 Å |
| TiO2 | 468 Å |
| Ag | 149 Å |
| Ti | 20 Å |
| TiO2 | 546 Å |
| Ag | 206 Å |
| Ti | 20 Å |
| TiO2 | 280 Å |

Table 2 below illustrates three more exemplary film stacks that can be used as the present coating 7:

TABLE 2

| FILM | STACK B | STACK C | STACK D |
| --- | --- | --- | --- |
| Glass | Glass | Glass | Glass |
| SnO2 | 165 Å | 164 Å | 164 Å |
| Ag | 117 Å | 117 Å | 117 Å |
| Ti | 20 Å | 20 Å | 30 Å |
| SnO2 | 591 Å | 592 Å | 591 Å |
| Ag | 154 Å | 147 Å | 154 Å |
| Ti | 20 Å | 20 Å | 35 Å |
| SnO2 | 665 Å | 665 Å | 665 Å |
| Ag | 206 Å | 208 Å | 206 Å |
| Ti | 20 Å | 20 Å | 35 Å |
| SnO2 | 314 Å | 314 Å | 310 Å |

Table 3 below illustrates a further exemplary film stack that can be used, perhaps as a temperable coating, as the present coating 7. Here, the coating is representative of a class of embodiments wherein a triple silver coating is provided with at least about 50 angstroms (such as about 100 Å) of film comprising silicon dioxide directly on the substrate.

TABLE 3

| FILM | THICKNESS |
| --- | --- |
| Glass | |
| SiO2 | >50 Å |
| Zn + O | 164 Å |
| Ag | 130 Å |
| Ti | 35 Å |
| Zn + O | 599 Å |
| Ag | 165 Å |
| Ti | 35 Å |
| Zn + O | 667 Å |
| Ag | 218 Å |
| Ti | 35 Å |
| Zn + O | 313 Å |

Table 4 below illustrates another exemplary film stack that can be used, perhaps as a temperable coating, as the present coating 7:

TABLE 4

| FILM | THICKNESS |
| --- | --- |
| Glass | |
| SiO2 | >50 Å |
| Zn + O | 165 Å |
| Ag | 135 Å |
| Ti | 35 Å |
| Zn + O | 626 Å |
| Ag | 171 Å |
| Ti | 35 Å |
| Zn + O | 693 Å |
| Ag | 225 Å |
| Ti | 35 Å |
| Zn + O | 319 Å |

Table 4 is representative of a class of embodiments wherein a low-emissivity coating includes three infrared-reflective films having a combined thickness of at least about 525 angstroms. In addition, the outermost two infrared-reflective films in such embodiments can optionally have a combined thickness of at least about 385 angstroms.

Figure 5:
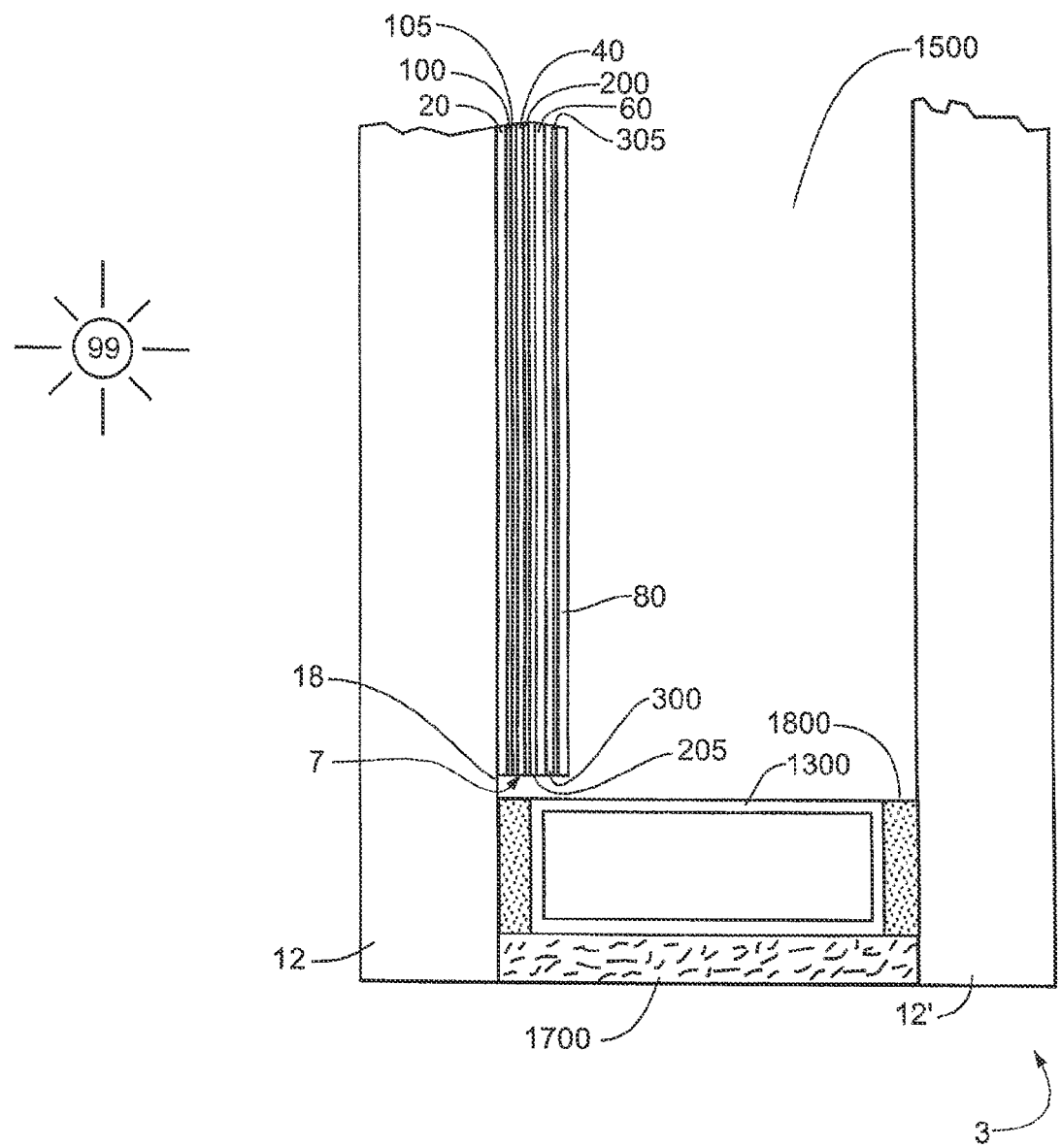
FIG. 5 is a schematic partially broken-away cross-sectional side view of a multiple-pane insulating glazing unit bearing a high infrared reflection coating in accordance with certain embodiments of the invention.

FIG. 5 schematically depicts a multiple-pane insulating glazing unit bearing a multiple cavity low-emissivity coating in accordance with certain embodiments of the invention. Here, the multiple cavity low-emissivity coating 7 is on the #2 surface of the IG unit 3, and the #1 surface is exposed to an outdoor environment. The IG unit here includes a spacer 130 adhered between the two panes 12, 12' by two deposits of sealant 1700, 1800. The spacer can alternatively be an integral part of a sash, frame, etc. Moreover, a single deposit of sealant can alternatively be used. In embodiments of this nature, the IG unit preferably is mounted on a sash and/or frame that maintains the IG unit in the illustrated/noted configuration.

Methods for depositing films onto a sheet-like substrate are also provided. In accordance with the present methods, a substrate 12 having a surface (e.g., a major surface) 18 is provided. If desired, this surface 18 can be prepared by suitable washing or chemical preparation. The present coating 7 is deposited on the surface 18 of the substrate 12, e.g., as a series of discrete layers, as a thickness of graded film, or as a combination including at least one discrete layer and at least one thickness of graded film. The coating can be deposited using any suitable thin film deposition technique. One preferred method is magnetron sputtering, which is commonly used in industry. Reference is made to Chapin's U.S. Pat. No. 4,166,018, the teachings of which are incorporated herein by reference. Thus, the present methods can involve sequentially depositing the film regions of any coating embodiment disclosed herein by any one or more thin film deposition techniques. One well known method is magnetron sputtering.

Briefly, magnetron sputtering involves transporting a substrate through a series of low pressure zones (or "chambers" or "bays") in which the various film regions that make up the coating are sequentially applied. Metallic film is sputtered from metallic sources or "targets," typically in an inert atmosphere such as argon. To deposit dielectric film, the target may be formed of the dielectric itself (e.g., zinc aluminum oxide or titanium oxide, optionally substoichiometric titania). In other cases, the dielectric film is applied by sputtering a metal target in a reactive atmosphere. To deposit zinc oxide, for example, a zinc target can be sputtered in an oxidizing atmosphere; silicon nitride can be deposited by sputtering a silicon target (which may be doped with aluminum or the like to improve conductivity) in a reactive atmosphere containing nitrogen gas. The thickness of the deposited film can be controlled by varying the speed of the substrate and/or by varying the power on the targets. The low-emissivity coating including (optionally having only) three infrared-reflective films can optionally have at least one of its films deposited by sputtering.

Another method for depositing thin film on a substrate involves plasma chemical vapor deposition. Reference is made to U.S. Pat. No. 4,619,729 (Johncock et al.) and U.S. Pat. No. 4,737,379 (Hudgens et al.), the teachings of both of which concerning CVD techniques are incorporated herein by reference. Such plasma chemical vapor deposition involves the decomposition of gaseous sources via a plasma and subsequent film formation onto solid surfaces, such as glass substrates. The film thickness can be adjusted by varying the speed of the substrate as it passes through a plasma zone and/or by varying the power and/or gas flow rate within each zone.

In certain embodiments, the low-emissivity coating is deposited in a coater having a series of sequentially connected sputtering chambers. The chambers preferably are vacuum deposition chambers in which controlled environments can be established. In some cases, each chamber is adapted for use at (e.g., is adapted for establishing and maintaining therein) a total gas pressure of less than about 140 torr, more preferably less than about 0.1 torr, and perhaps most commonly between about 1 mtorr. and about 0.1 torr. (e.g., between about 1 mtorr. and about 30 mtorr). Thus, the coater preferably has gas delivery and pumping systems adapted for establishing and maintaining pressures within any range or ranges described in this paragraph.

Some embodiments involve a coater having more than 36 sputtering chambers (or "bays"), at least 40 chambers, at least 45 chambers, or at least 50 chambers (such as more than 52, at least 55, more than 56, at least 60, at least 63, or at least 65). In these embodiments, the large number of deposition chambers allows an incredibly wide variety of coatings to be manufactured with a single coater. Particularly complex coatings can also be deposited in a single pass of the substrate through the coater. In preferred embodiments, a low-emissivity coating having three infrared-reflective layers is deposited in a single pass of the substrate through the coater. Preferably, the single pass of the substrate is continuous, so the coating process is not interrupted by stopping the substrate, or removing the substrate from the coater, during the single pass. In many cases, the single pass of the substrate through the coater is carried out by moving the glass sheet substantially linearly in a substantially constant direction. The substrate can optionally be moved at a substantially constant rate of speed throughout the entirety of the single pass.

Figure 9:
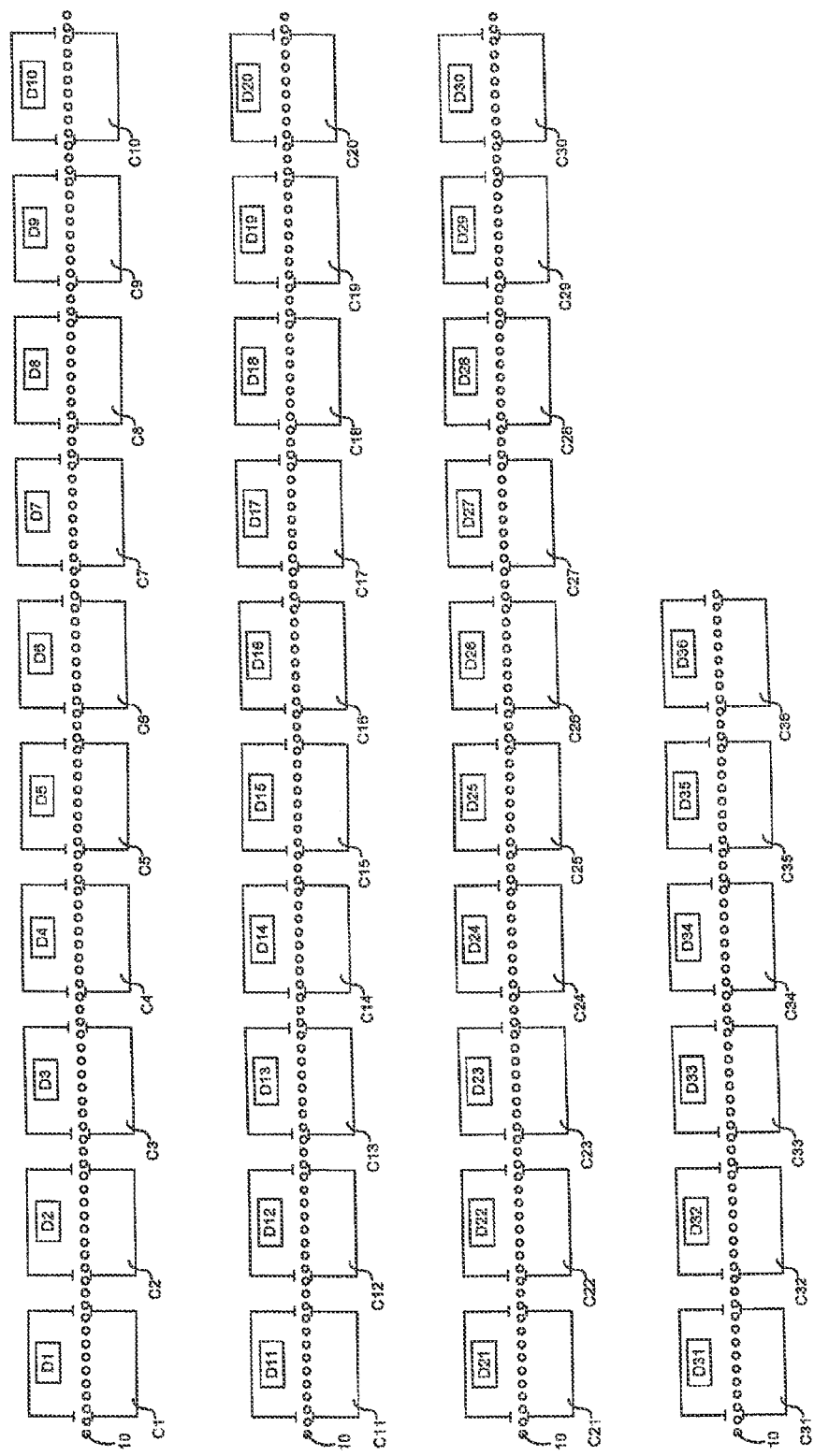
FIG. 9 is a schematic side view of a coater in accordance with certain embodiments of the invention.
Figure 13:
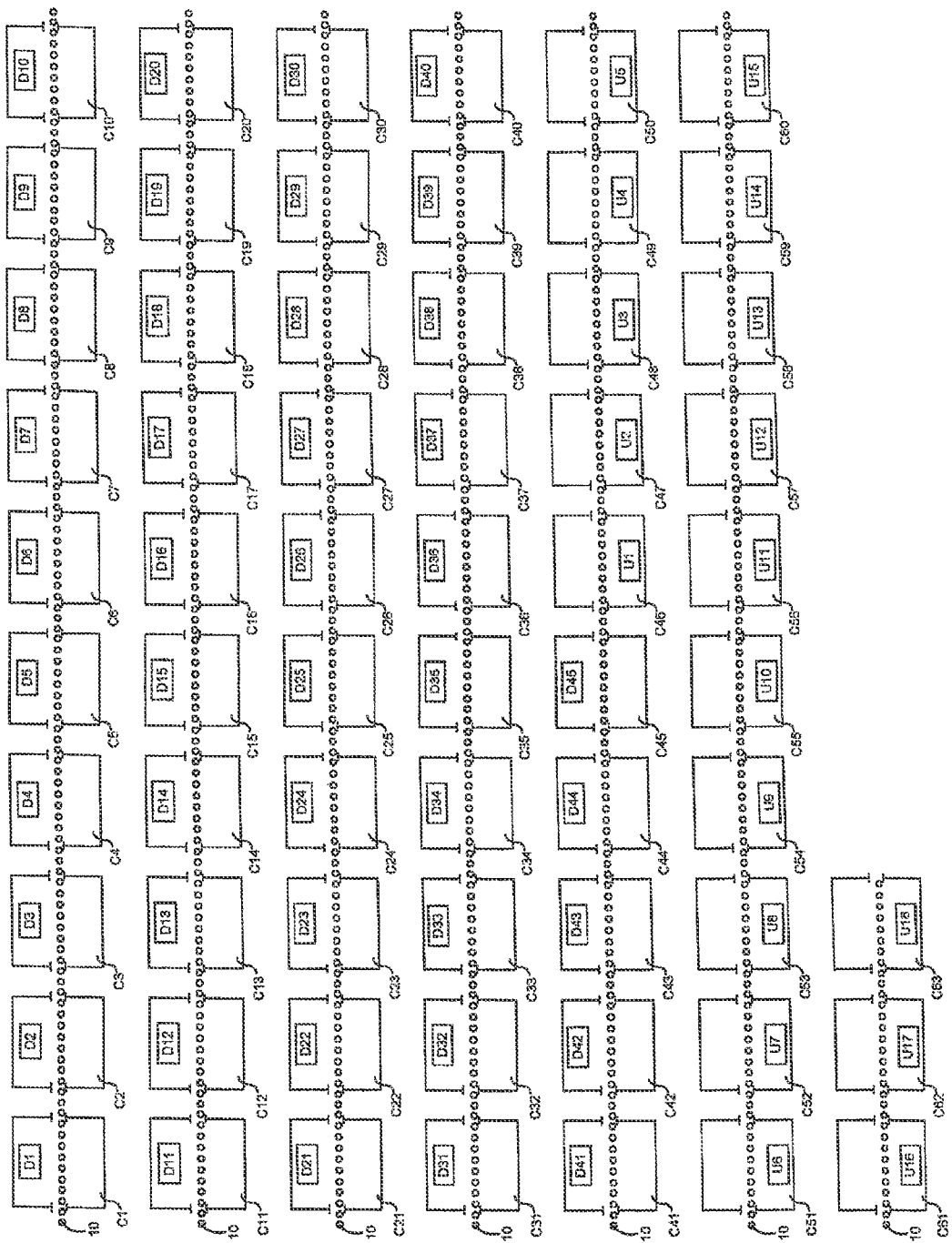
FIG. 13 is a schematic side view of a coater in accordance with certain embodiments of the invention.

In some embodiments, the coater has a large number of downward sputtering chambers. For example, the coater can optionally include at least 36 downward sputtering chambers, at least 39 downward sputtering chambers, at least 42 downward sputtering chambers, or at least 45 downward sputtering chambers. Reference is made to FIG. 9. Here, the coater has at least 36 chambers adapted for downward sputtering. In FIG. 13, the coater has at least 45 chambers adapted for downward sputtering. Coaters of this nature provide a number of benefits. For example, they allow particularly thick and/or complex coatings to be deposited by downward sputtering, and these coatings therefore need not contact the transport rollers on which the substrates are conveyed. Particularly thick and/or complex coatings may be more likely (in comparison to thinner and/or more simple coatings) to show visible traces of contact or other undesirable damage from transport rollers or other substrate supports.

Figure 11:
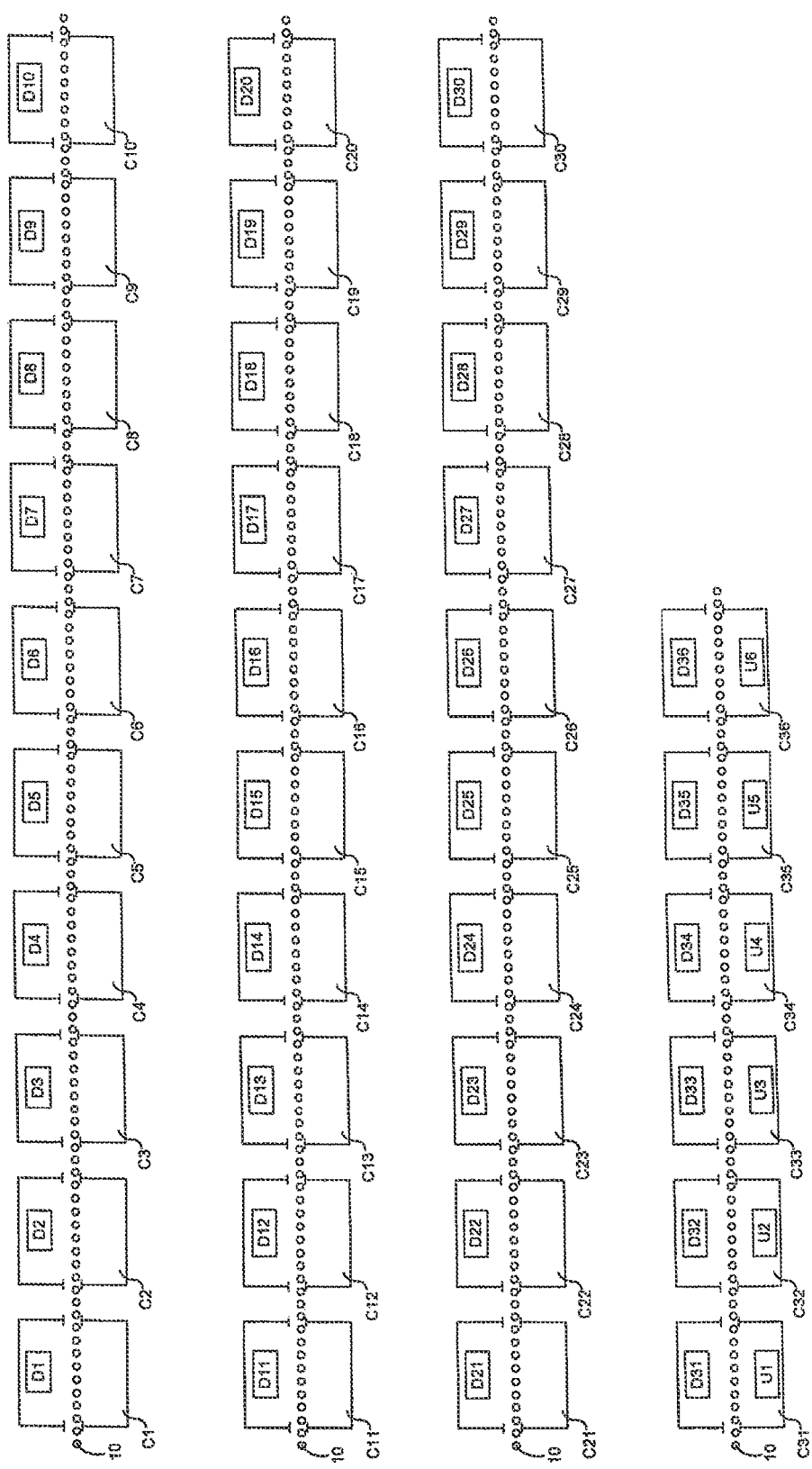
FIG. 11 is a schematic side view of a coater in accordance with certain embodiments of the invention.

In the foregoing embodiments, each downward sputtering chamber may be adapted for downward-only sputtering, or for dual-direction sputtering. FIG. 11 shows 30 downward sputtering chambers C1-C30 adapted for downward-only sputtering, and six downward sputtering chambers C31-C36 adapted for dual-direction sputtering. FIG. 13 shows 45 downward sputtering chambers C1-C45 adapted for downward-only sputtering, and 18 downward sputtering chambers C46-C63 adapted for dual-direction sputtering.

Figure 10:
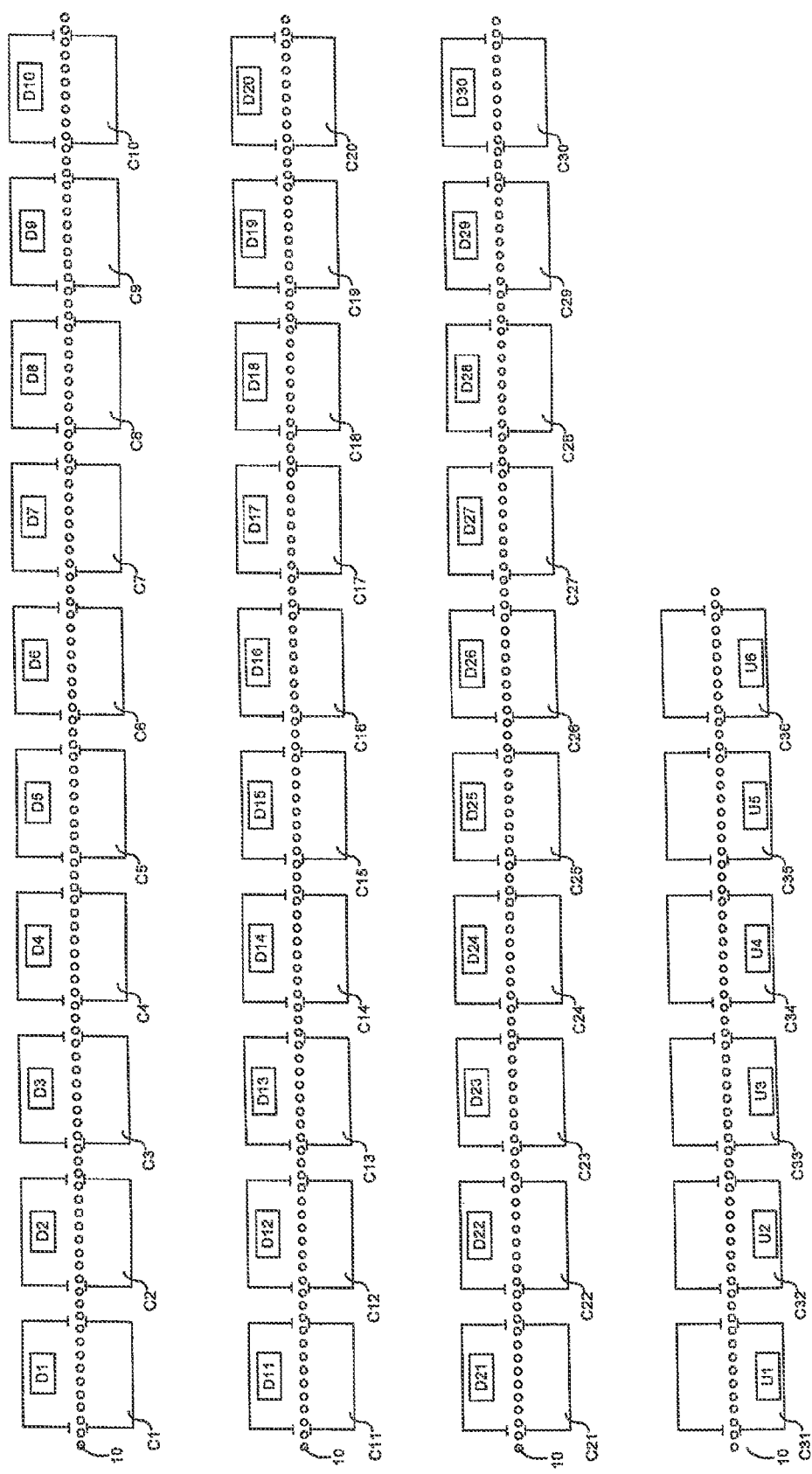
FIG. 10 is a schematic side view of a coater in accordance with certain embodiments of the invention.

FIGS. 10 and 13 exemplify certain method and equipment embodiments involving a coater with an upward sputtering section and a downward sputtering section. The upward sputtering section is characterized by a series of lower targets at a lower elevation than the path of substrate travel, while the downward sputtering section is characterized by a series of upper targets at a higher elevation than the path of substrate travel. In some of these embodiments, the downward sputtering section includes at least 36, at least 39, at least 42, or at least 45 chambers adapted for downward-only sputtering. Additionally or alternatively, the upward sputtering section can optionally include at least 9, at least 18, or at least 21 chambers adapted for upward-only sputtering. In some cases, the coater has more than twice as many chambers adapted for downward sputtering (including downward-only sputtering and dual-direction sputtering) as chambers adapted for upward sputtering (including upward-only sputtering and dual-direction sputtering). These coaters can be used advantageously, for example, to deposit relatively thin and/or less complex coatings on the bottoms of substrates.

In some embodiments involving a coater with an upward sputtering section and a downward sputtering section, oxidizing sputtering atmospheres are maintained in all active chambers of the upward sputtering section, and nitriding sputtering atmospheres are maintained in a plurality of the chambers of the downward sputtering section. Related method embodiments comprise reactively sputtering all the active lower targets upwardly in oxidizing gas and reactively sputtering a plurality of the upper targets downwardly in nitriding gas. These methods, for example, can involve depositing a coating consisting essentially of oxide film(s) on the bottom of a glass sheet, and depositing a coating comprising a plurality of nitride films on the top of the glass sheet.

Generally, the substrate is conveyed through the coater at a speed in the range of about 100-500 inches per minute. Desirably, the substrate is conveyed at a rate exceeding 200 inches per minute, such as greater than 250 inches per minute, greater than 275 inches per minute, 300 inches per minute or faster, greater than 300 inches per minute, 310 inches per minute or faster, greater than 310 inches per minute, or greater than 325 inches per minute. If desired, the process can be adapted to employ a conveyance rate of 400 inches per minute or faster, greater than 500 inches per minute, 510 inches per minute or faster, or 525 inches per minute or faster.

Some embodiments involve depositing a triple-silver low-emissivity coating using a substrate conveyance rate exceeding 275 inches per minute, perhaps more preferably 300 inches per minute or faster, or 310 inches per minute or faster. It is surmised that high conveyance rates, surprisingly, can facilitate improved coating quality, and that the improvement becomes acute for triple-silver low-emissivity coatings. For example, it is surmised that high conveyance rate sputtering of silver at high power levels yields higher quality, perhaps less oxidized, silver film. Thus, the present invention provides embodiments wherein a coating with a particularly large total thickness of silver (or another infrared-reflective metal), such as a triple-silver low-emissivity coating, is deposited at a high conveyance rate, preferably using a sputtering process that involves high power level sputter deposition of the silver or other reflective metal. Accordingly, some embodiments involve a combination of using a high conveyance rate and depositing a large total thickness of silver and/or other infrared-reflective metal(s).

One particular embodiment group involves a coating with three infrared-reflective film regions deposited by sputtering silver-containing targets at an average power level exceeding 8.5 kW, or exceeding 9 kW. In some cases, at least one of these silver-containing targets is sputtered at a power level exceeding 12 kW. Exemplary embodiments are described below in connection with Table 5.

As discussed above, the coater preferably comprises a series of connected chambers (e.g., a line of connected deposition chamber, i.e., a "coating line"). Such a coating line may comprise a series of chambers aligned and connected so that a substrate (preferably a plurality of spaced-apart sheet-like substrates, e.g., glass sheets) supported on spaced-apart transport rollers can be conveyed through the chambers of the line sequentially. Preferably, the coating line includes narrow evacuated tunnels, which connect adjacent chambers, through which horizontally-oriented substrates are conveyed from one chamber to the next. During film deposition, the substrate is typically conveyed through all the chambers of the coating line. It is to be appreciated that the coater can include a plurality of chambers aligned and connected in this manner, regardless of the particular deposition processes that are performed in such chambers. Moreover, the noted rates can be used in conveying the substrate through a coater having any type(s) of deposition equipment (sputter equipment, CVD equipment, evaporation equipment, etc.).

The coater can optionally include different chambers adapted respectively for carrying out different deposition processes. For example, the coater can include one or more chambers in which sputtering is performed and one or more chambers in which an ion beam film deposition technique is performed. Further, the coater can include one or more chambers in which sputtering is performed and one or more chambers in which chemical vapor deposition is performed. Alternatively, the coater can include one or more chambers in which chemical vapor deposition is performed and one or more chambers in which evaporation is performed. Various alternatives of this nature will be apparent to skilled artisans given the present teaching as a guide.

Figure 6:
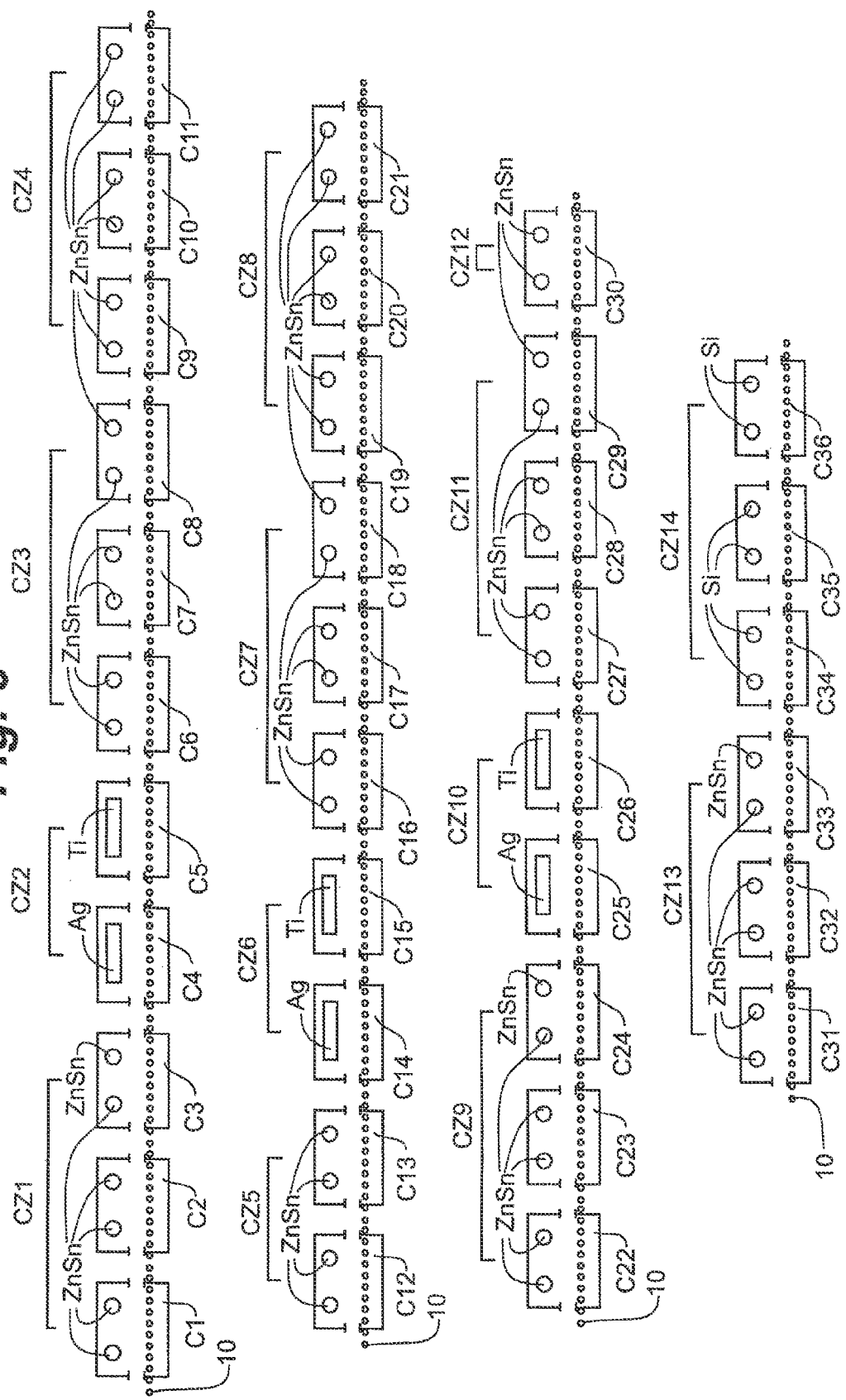
FIG. 6 is a schematic side view of a coating chamber in accordance with certain embodiments of the present invention.

In preferred embodiments, the coater includes one or more sputtering chambers. In particularly preferred embodiments, all of the chambers in the coater are sputtering chambers. In some cases, one or more of the sputtering chambers have downward coating equipment. FIG. 6 illustrates an exemplary sputtering chamber having downward coating equipment. The illustrated sputtering chamber 400 includes a base (or "floor") 420, a plurality of side walls 422, and a ceiling (or "top lid" or "cover") 430, together bounding a sputtering cavity 402. Two upper targets 480a are mounted above the path of substrate travel 45. The substrate 12 is conveyed along the path of substrate travel 45 during film deposition, optionally over a plurality of spaced-apart transport rollers.

In FIG. 6, two upper targets are provided, although this is by no means required. For example, a single target or more than two targets could alternatively be used in the chamber. Moreover, the chamber can include planar targets, although cylindrical targets are shown. Preferably, each upper target 480a is adjacent to one or more upper gas distribution pipes positioned (e.g., each having at least one gas-delivery outlet) above the path of substrate travel. Each upper target 480a also is also preferably adjacent to one or more upper anodes positioned above the path of substrate travel. Preferably, each target also includes a magnet assembly positioned adjacent the target body (mounted inside a cylindrical target, mounted behind a planar target, etc.).

Figure 8:
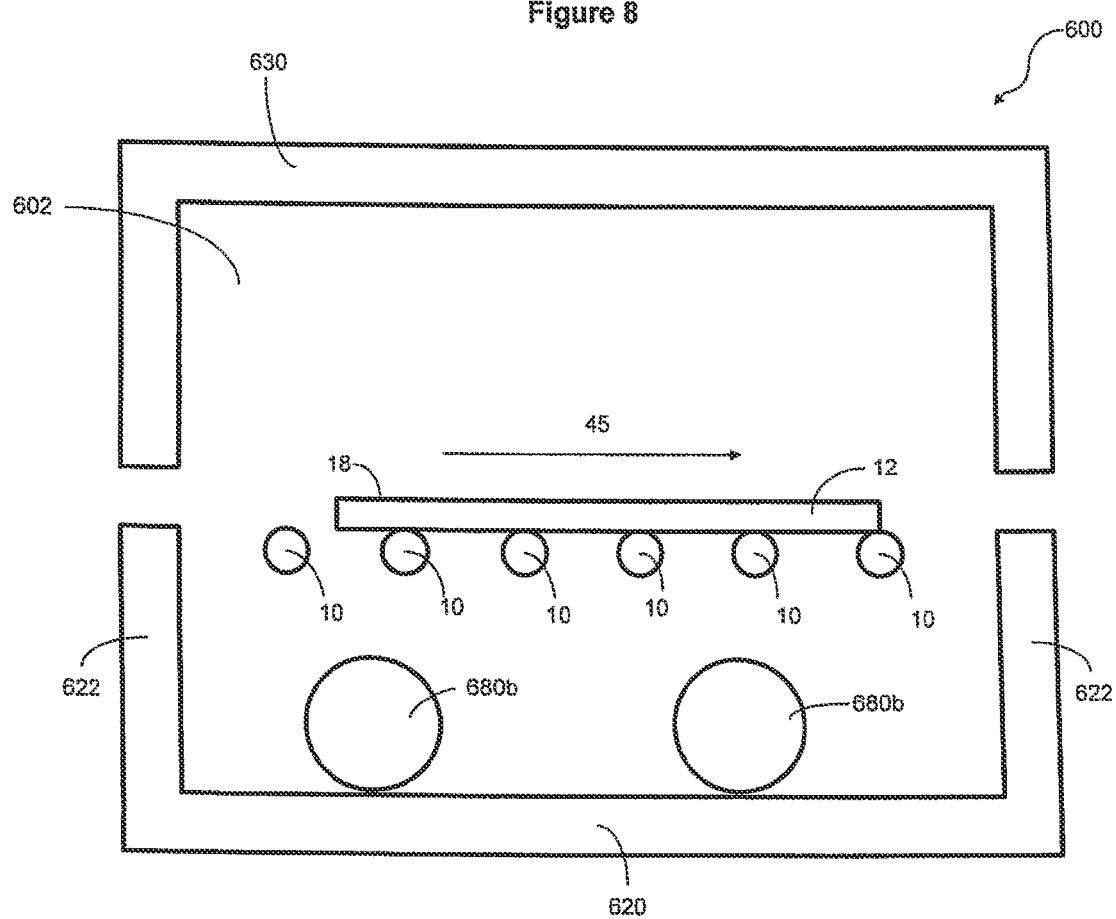
FIG. 8 is a schematic side view of a coating chamber in accordance with certain embodiments of the invention.

In other cases, as illustrated in FIG. 8, the coater includes one or more sputtering chambers having upward coating equipment. FIG. 8 illustrates an exemplary sputtering chamber having only upward coating equipment. The illustrated sputtering chamber 600 includes a base (or "floor") 620, a plurality of side walls 622, and a ceiling (or "top lid" or "cover") 630, together bounding a sputtering cavity 602. Two lower targets 680b are mounted below the path of substrate travel 45. The substrate 12 is conveyed along the path of substrate travel 45 during film deposition, optionally over a plurality of spaced-apart rollers 10. The lower targets 680b are sputtered to deposit film onto the bottom surface of the substrate. Each upward sputtering apparatus preferably is adjacent to one or more lower gas distribution pipes positioned (e.g., each having at least one gas-delivery outlet) below the path of substrate travel 45. Optional lower anodes can be positioned below the path of substrate travel, adjacent to at least one lower target. Each lower target desirably comprises a magnet assembly, as described above. Particularly useful upward sputtering apparatuses are described in U.S. patent application Ser. Nos. 09/868,542, 09/868,543, 09/979, 314, 09/572,766, and 09/599,301, the entire contents of each of which are incorporated herein by reference.

Figure 7:
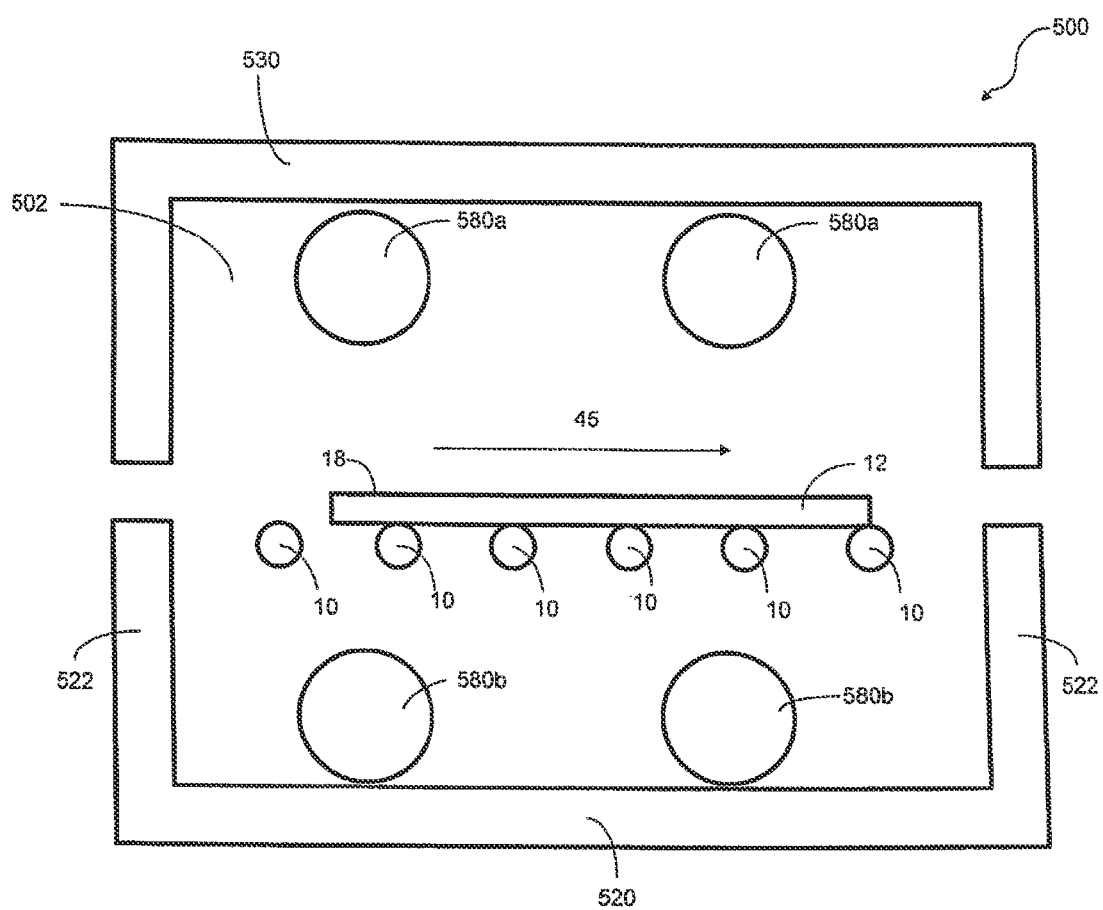
FIG. 7 is a schematic side view of a coating chamber in accordance with certain embodiments of the invention.

In other cases, as illustrated in FIG. 7, the coater includes one or more sputtering chambers having dual direction coating equipment. FIG. 7 illustrates an exemplary sputtering chamber having both downward and upward coating equipment. Dual direction sputtering chambers are described in U.S. patent application Ser. Nos. 09/868,542, 10/911,155, and 10/922,719, the entire teachings of each of which are incorporated herein by reference. The illustrated sputtering chamber 500 includes a base (or "floor") 520, a plurality of side walls 522, and a ceiling (or "top lid" or "cover") 530, together bounding a sputtering cavity 502. Two upper targets 580a are mounted above the path of substrate travel 45 and two lower targets 580b are mounted below the path of substrate travel. The substrate 12 is conveyed along the path of substrate travel 45 during film deposition, optionally over a plurality of spaced-apart rollers 10. Here, the upper targets 580a and the lower targets 580b can all be sputtered simultaneously to deposit film on both major surfaces of the substrate. Alternatively, the upper targets alone may be operated, or the lower targets alone may be operated.

Exemplary coater configurations are shown in FIGS. 9-13. The coater in each figure has a substrate support 10 defining a path of substrate travel extending through the coater. Transport rollers define the illustrated paths of substrate travel, although conveyor belts or other substrate supports can be used. Preferably, the path of substrate travel extends generally or substantially horizontally through the coater. The chambers are typically connected such that the path of substrate travel extends through all the deposition chambers of the coater.

Preferably, the substrate support 10 is configured for maintaining (e.g., supporting) the substrate in a generally or substantially horizontal position while the substrate is being coated (e.g., during conveyance of the substrate through the coater). Thus, the support 10 desirably is adapted to convey a sheet-like substrate, and preferably multiple sheet-like substrates spaced-apart from one another, through the coater while maintaining the/each substrate in a generally or substantially horizontal orientation (e.g., wherein a top major surface of the/each substrate is oriented upwardly while a bottom major surface of the/each substrate is oriented downwardly).

Preferably, the substrate support 10 comprises a plurality of spaced-apart transport rollers. Typically, at least one of the rollers is rotated (e.g., by energizing a motor operably connected to the roller) such that the substrate is conveyed along the path of substrate travel. When the substrate is conveyed on such rollers, the bottom surface of the substrate is in direct physical (i.e., supportive) contact with the rollers. Thus, certain methods of the invention involve a glass sheet and a plurality of spaced-apart transport rollers, and the method comprises rotating at least one of the rollers to convey the glass sheet, such that the bottom major surface of the glass sheet comes into direct physical contact with the rollers during conveyance.

Thus, in certain embodiments, the substrate is a glass sheet that is on (e.g., positioned on top of) the support 10 during conveyance. In some cases, other glass sheets are also positioned on the support 10, and are spaced apart from one another on the support 10 and conveyed in such a spaced-apart configuration.

In embodiments where the support 10 comprises rollers, the rollers can be of any conventional structure. It has been found that good results can be obtained by employing cylindrical (e.g., aluminum) tubes about which a rope is spirally wound, such rope providing the surface with which the substrate is in direct contact. The rope, for example, can be formed of Kevlar™, i.e., poly-para-phenylene terephthalamide, or another polymer (e.g., nylon-like polymer). Preferably, a high melting point polymer is used (e.g., a polymer having a melting point above the maximum processing temperature established in the desired deposition process, e.g., at least about 165 degrees C., more preferably at least about 200 degrees C., and perhaps optimally at least about 400 degrees C.). Cylinders carrying a spirally-wound rope (or a plurality of individual bands) are particularly desirable for embodiments wherein an upward coating process is performed, as the rope reduces the area of contact between the rollers and the substrate's bottom surface and thus provides a particularly non-damaging support for the substrate's freshly-coated bottom surface. Thus, in certain embodiments, the substrate support comprises a plurality of spaced-apart rollers each comprising at least one rope disposed about a cylinder.

In embodiments where the support 10 comprises spaced-apart rollers, the spacing of the rollers is preferably kept fairly small to permit small substrates to be processed without any significant risk of having the substrates fall between the rollers. The maximum safe spacing is preferably determined on a case-by-case basis for a desired range of substrate sizes.

While small substrates can be coated, the invention is advantageous for processing large-area substrates, such as glass sheets for architectural and automotive glass applications. Thus, in certain methods of the invention, the substrate conveyed through the coater is a large-area substrate having a major dimension (e.g., a length or width) of at least about 0.5 meter, at least 1 meter, at least 1.5 meters, or at least 2 meters. With large-area substrates in particular (especially those formed of glass), it is advantageous to convey the substrate through the coater in a generally or substantially horizontal orientation.

In some embodiments, the coater only includes chambers (or bays) having downward coating equipment. In other embodiments, the coater also includes chambers having upward coating equipment. The coater in FIG. 9 only has downward coating equipment. The downward coating equipment is adapted for coating a top major surface 18 of a substrate 12. Thus, the downward coating equipment preferably is above the path of substrate travel 45. In certain embodiments, the coater is a vacuum coater and the downward coating equipment comprises at least one downward vacuum-coating apparatus. Each downward coating apparatus in FIG. 9 can be any type of downward coating apparatus. Preferably, the coater includes at least one downward sputtering apparatus comprising an upper sputtering target located above the path of substrate travel. In some embodiments, each downward sputtering apparatus comprises two upper targets above the path of travel, as described with reference to the embodiments of FIG. 6. In certain embodiments, all the downward deposition devices D1-D36 in FIG. 9 are sputtering devices.

In certain embodiments, the coater of FIG. 9 includes at least one deposition chamber having a downward chemical vapor deposition (CVD) apparatus. Such an apparatus may comprise a gas delivery system for delivering precursor gas to the upper region of the coater (i.e., the region of the coater above the path of substrate travel). Preferably, such an apparatus comprises a gas-delivery outlet located above the path of substrate travel, such that from the precursor gas, coating material condenses upon the top surface 18 of the substrate 10. A CVD apparatus of this nature will typically comprise a gas supply from which the precursor gas is delivered through a gas line, out of the gas outlet, and into the upper region of the coater. If so desired, such a downward chemical vapor deposition apparatus can be a plasma-enhanced chemical vapor deposition apparatus of the type described in U.S. patent application Ser. No. 10/373,703, entitled "Plasma-Enhanced Film Deposition" (Hartig), the entire teachings of which are incorporated herein by reference.

In certain embodiments, the coater of FIG. 9 includes at least one deposition chamber having a downward coating apparatus comprising an ion gun. An upper ion gun of this nature can be adapted for carrying out any desired ion-assisted deposition (IAD) process. For example, such an ion gun can be adapted for direct film deposition. Alternatively, such an ion gun can be part of an ion beam sputter deposition source comprising an upper sputtering target against which the ion gun accelerates ions, such that atoms of the target material are ejected from the target downwardly toward the substrate's top surface. These types of IAD methods are known in the art, as are many other suitable IAD methods.

The deposition chambers of a coater can be grouped into coat zones. Each coat zone can include any number of chambers or bays. The specific configuration of the coater (e.g., its number of deposition chambers) will vary depending on the particular type of coater used and the particular type of coating desired. Generally, the coater includes at least 20 deposition chambers, optionally arranged along a linear path of substrate travel. In preferred embodiments, the coater includes at least 36 deposition chambers, at least 39 deposition chambers, at least 42 deposition chambers, at least 45 deposition chambers, at least 55 deposition chambers, at least 60 deposition chambers, or at least 63 deposition chambers. The exemplary coaters of FIGS. 9-12 have at least 36 deposition chambers, and the exemplary coater of FIG. 13 has at least 63 deposition chambers.

FIG. 10 illustrates a coater with some chambers having downward coating equipment and other chambers having upward coating equipment. Here, the coater preferably can be operated (i.e., it preferably is adapted) to coat the entirety of both major surfaces of a sheet-like substrate in a single pass of the substrate through the coater. The downward coating equipment can, for example, be the types of downward coating equipment described above with reference to FIG. 9. With respect to the upward coating equipment, each upward coating apparatus preferably is mounted below the path of substrate travel and is adapted for coating the bottom surface of the substrate.

Each upward coating apparatus in FIG. 10 can be any type of upward coating apparatus. In certain embodiments, the coater includes at least one upward sputtering apparatus. In these embodiments, each upward sputtering apparatus includes a lower sputtering target below the path of substrate travel. Useful upward sputtering apparatuses are described in U.S. patent application Ser. Nos. 09/868,542, 09/868,543, 09/979,314, 09/572,766, and 09/599,301, the entire contents of each of which are incorporated herein by reference. In some cases, the upward sputtering apparatus comprises two lower targets mounted beneath the path of substrate travel, as described with reference to FIG. 8. In preferred embodiments, all the upward U1-U6 and downward D1-D30 deposition devices are sputtering devices.

In certain embodiments, the coater of FIG. 10 includes at least one upward evaporation coating apparatus. Such an apparatus may comprise a source of coating material to be evaporated, the source typically being located beneath the path of substrate travel. This source of material can be provided in the form of a boat, crucible, strip, or coil that contains, or is formed of, the desired source material. Such an apparatus typically also comprises means for delivering energy to the source material. For example, the source material can be provided in conjunction with a heat source (e.g., a heating element) adapted for heating the source material by direct or indirect resistance, thermal conduction, radiation or induction, electron beam, laser irradiation, or arcing. Various processes and apparatuses are known in the art for coating substrates by upward evaporation.

In other embodiments, the coater of FIG. 10 includes at least one upward CVD apparatus. Such an apparatus may comprise a gas delivery system for delivering precursor gas to the lower region of the coater. Preferably, such an apparatus comprises a gas-delivery outlet located below the path of the substrate travel, such that from the precursor gas, coating material condenses upon the bottom surface of the substrate 12. A CVD apparatus of this nature will typically comprise a gas supply from which the precursor gas is delivered through the gas line, out of the gas outlet, and into the lower region of the coater.

In certain preferred embodiments, the coater of FIG. 10 includes at least one upward coating apparatus comprising an ion gun. A lower ion gun of this nature can be adapted for carrying out any desired IAD process. For example, such an ion gun can be adapted for carrying out direct film deposition. Alternatively, such an ion gun can be part of an ion beam sputter deposition source comprising a lower sputtering target against which the ion gun accelerates ions, such that atoms of the target material are ejected from the target upwardly toward the substrate's bottom surface. These types of IAD methods are known in the art, as are many other suitable IAD methods. In one embodiment, the coater includes one or more lower ion guns adapted for carrying out an ion-assisted evaporation technique. Reference is made to the publication "Ion-Based Methods For Optical Thin Film Deposition" (Journal of Material Science; J. P. Marting, 21 (1986) 1-25), the entire contents of which are incorporated herein by reference.

Preferably, each upward coating apparatus is positioned beneath (e.g., directly underneath) a gap between an adjacent pair of transport rollers 10. The gap may result from conventional transport roller spacing. Alternatively, this gap may be wider than conventional roller spacing. This can be accomplished by mounting the rollers that define each such gap further apart and/or by decreasing the size of these rollers.

In some embodiments, the downward and upward coating equipment in a coater (e.g., like that of FIG. 10, FIG. 11, or FIG. 13) can both be the same basic type of coating equipment (e.g., all the film deposition equipment in the coater can be sputtering equipment). Alternatively, the downward coating equipment can be one type of coating equipment, while the upward coating equipment is another type of coating equipment (e.g., the downward coating equipment can be conventional magnetron sputtering equipment, while the upward coating equipment is ion beam film deposition equipment). As another alternative, the upward coating equipment and/or the downward coating equipment can include a combination of different types of coating equipment (e.g., the coater can have some upward sputtering equipment and some upward evaporation equipment).

FIG. 11 illustrates a coater with some chambers that only have downward coating equipment and other chambers that have both downward and upward coating equipment. The downward coating equipment can be any types described with reference to FIG. 9, and the upward coating equipment can be any types described with reference to FIG. 10. In some cases, the downward and upward coating equipment in the dual-direction deposition chambers are the same or similar types of coating equipment (e.g., they may all be sputtering devices), although this is not required.

The coaters exemplified in FIGS. 9-11 preferably are used to deposit a low-emissivity coating having three infrared-reflection or more layers. Downward coating equipment preferably is used to deposit the low-emissivity coating. When downward coating equipment is operated to deposit a low-emissivity coating on a substrate's top surface 18, the method typically involves applying films of reflective metal between transparent dielectric films. In some cases, this involves depositing at least seven film regions having the following sequence of films (e.g., moving outwardly from surface 18): a first transparent dielectric film region 20, a first infrared-reflection film region 100, a third transparent dielectric film region 40, a second infrared-reflection film region 200, a third transparent dielectric film region 60, a third infrared-reflection film region 300, and a fourth transparent dielectric film region 80. The method can optionally include depositing blocker layers 105, 205 and 305 over the infrared-reflection film regions.

In certain embodiments, downward coating equipment is operated to deposit a low-emissivity coating, and the method involves depositing at least 50 angstroms, or at least 100 angstroms, of transparent dielectric film between the surface 18 of the substrate and a first infrared-reflection film region 100, depositing at least 100 angstroms of transparent dielectric film between the first 100 and a second 200 infrared-reflection film regions, depositing at least 100 angstroms of transparent dielectric film between the second 200 and a third 300 infrared-reflection film regions, and depositing at least 50 angstroms, or at least 100 angstroms, of transparent dielectric film over the third infrared-reflection film region 300. In some cases, the downward coating equipment is operated to deposit less than 175 angstroms of transparent dielectric film between the top surface 18 of the substrate and the first infrared-reflection film region 100. In one embodiment, the downward coating equipment is operated to deposit at least 400 angstroms of transparent dielectric film between the first 100 and second 200 infrared-reflection film regions, and to deposit at least 400 angstroms of transparent dielectric film between the second 200 and third 300 infrared-reflection film regions.

With reference to FIGS. 10, 11, and 13, upward coating equipment can be used to deposit a desired coating on a bottom surface of a substrate 12. Preferably, both a low-emissivity coating and the desired coating are deposited during a single pass of the substrate through the coater. The desired coating can include, for example, a sequence of film regions characterized by, moving away from the bottom surface of the substrate, a primary film region comprising a first transparent dielectric material and a secondary film region comprising a second transparent dielectric material.

In some embodiments, the coater can be operated to deposit a low-emissivity coating on the top surface of the substrate, and to deposit a surface-effect coating on the bottom surface of the substrate. When provided, the surface-effect coating preferably is selected from the group consisting of a photocatalytic coating, a hydrophilic coating, and a hydrophobic coating. In certain embodiments, there is provided a surface-effect coating comprising titanium oxide and/or silicon oxide. In one embodiment, the surface-effect coating is a photocatalytic coating comprising titanium oxide (e.g., $TiO_2$).

Photocatalytic coatings typically comprise a semiconductor that can absorb ultraviolet radiation and can photocatalytically degrade organic materials such as oil, plant matter, fats, and greases. The most powerful of the photocatalysts appears to be titanium oxide (e.g., titanium dioxide). Useful photocatalytic coatings are described in U.S. Pat. No. 5,874,701 (Watanabe et al), U.S. Pat. No. 5,853,866 (Watanabe et al), U.S. Pat. No. 5,961,843 (Hayakawa et al.), U.S. Pat. No. 6,139,803 (Watanabe et al.), U.S. Pat. No. 6,191,062 (Hayakawa et al.), U.S. Pat. No. 5,939,194 (Hashimoto et al.), U.S. Pat. No. 6,013,372 (Hayakawa et al.), U.S. Pat. No. 6,090,489 (Hayakawa et al.), U.S. Pat. No. 6,210,779 (Watanabe et al), U.S. Pat. No. 6,165,256 (Hayakawa et al.), and U.S. Pat. No. 5,616,532 (Heller et al.), as well as U.S. patent application Ser. Nos. 11/179,178 and 11/179,852, the contents of each of which are incorporated herein by reference for their teachings of exemplary photocatalytic coatings and useful deposition methods.

Thus, in certain embodiments, the coater includes upward coating equipment adapted for applying a photocatalytic coating, optionally one comprising titania. The upward coating equipment can, for example, comprise a source or sources of titanium and oxygen. For example, the upward coating equipment can optionally include a lower sputtering target comprising titanium (e.g., metallic titanium or titanium oxide). Conjointly, the lower region of the coater adjacent such a target can optionally be provided with an oxidizing atmosphere. In one embodiment, the upward coating equipment comprises at least one lower sputtering target of the nature described in U.S. patent application 60/262,878, the entire teachings of which are incorporated herein by reference.

When a low-emissivity coating and a surface-effect coating are deposited in a coater like that of FIG. 11, a portion (e.g., less than the entirety) of the low-emissivity coating and the entirety of the surface-effect coating are deposited simultaneously. For example, downward deposition equipment D31-D36 can be operated at the same time as upward deposition equipment U1-U6. On the other hand, when a low-emissivity coating and a surface-effect coating are deposited in a coater like that of FIG. 10, they are deposited sequentially (e.g., the low-emissivity coating can be deposited first by downward sputtering, then the surface-effect coating can be deposited by upward sputtering, all during a single pass of the substrate through the coater) or even intermixed. Intermixing means that the upward deposition and downward deposition can be performed at the same location (e.g., in the same sputtering bay) provided that by layer stack design the materials are used in the same order of application.

Figure 12:
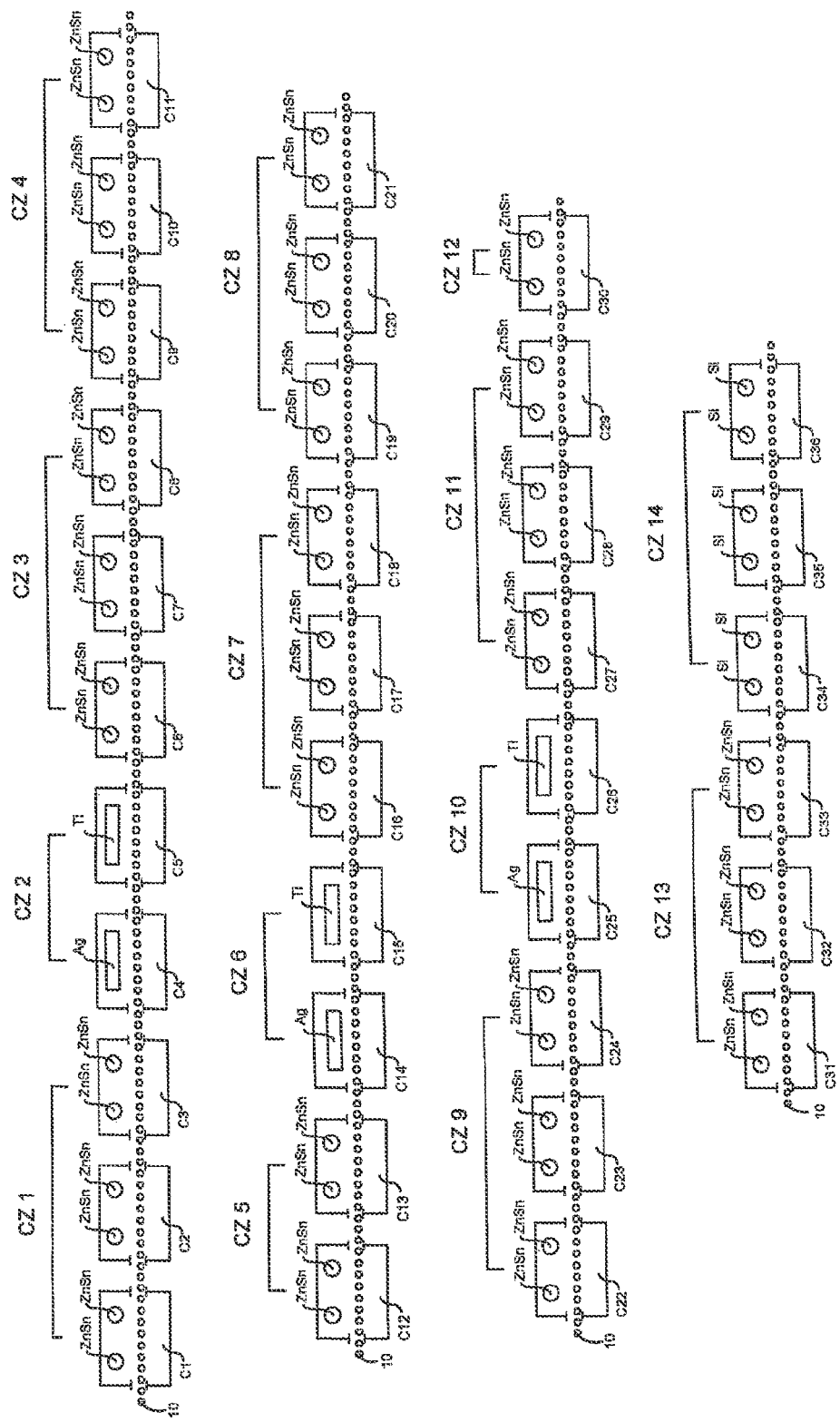
FIG. 12 is a schematic side view of a coater in accordance with certain embodiments of the invention.

Turning now to FIG. 12, there is described an exemplary method for depositing a high infrared-reflection coating 7 in accordance with certain embodiments of the invention. The coater shown schematically in FIG. 12 is used to deposit a coating 7 that includes, in sequence from major surface 18 outwardly, a first transparent dielectric film region 20 comprising zinc tin oxide, a first infrared-reflection film region 100 comprising silver, a first blocker film region 105 comprising titanium, a second transparent dielectric film region 40 comprising zinc tin oxide, a second infrared-reflection film region 200 comprising silver, a second blocker film region 205 comprising titanium, a third transparent dielectric film region 60 comprising zinc tin oxide, a third infrared-reflection film region 300 comprising silver, a third blocker film region 305 comprising titanium, and a fourth transparent dielectric film region 80 that includes an outermost layer comprising silicon nitride over a layer comprising zinc tin oxide.

With continued reference to FIG. 12, the substrate 12 is positioned at the beginning of the coater and conveyed into the first coat zone CZ1 (e.g., by conveying the substrate along transport rollers forming the substrate support 10). This coat zone CZ1 has three sputtering chambers (or "bays"), C1 through C3, which are adapted collectively to deposit a first transparent dielectric film region 20 comprising zinc tin oxide. All three of these bays are provided with sputtering targets comprising a compound of zinc and tin. Each of these bays is illustrated as having two cylindrical sputtering targets, although the number and type (e.g., cylindrical versus planar) can be varied as desired. These first six targets are sputtered in an oxidizing atmosphere to deposit the first transparent dielectric film region 20 in the form of an oxide film comprising zinc and tin. The oxidizing atmosphere can consist essentially of oxygen (e.g., about 100% $O_2$) at a pressure of about $4 \times 10^{-3}$ mbar. Alternatively, this atmosphere may comprise argon and oxygen. With reference to Table 5 below, a power of about 36.7 kW is applied to the first two targets, a power of about 34.6 kW is applied to the second two targets, and a power of about 35.5 kW is applied to the third two targets. The substrate 12 is conveyed beneath all six of these targets at a rate of about 310 inches per minute, while sputtering each target at the described power level, thereby depositing the first transparent dielectric film region 20 in the form of an oxide film comprising zinc and tin and having a thickness of about 159 angstroms.

The substrate 12 is then conveyed into a second coat zone CZ2 wherein the first infrared-reflection film region 100 is applied directly over the first transparent dielectric film region 20. The second coat zone CZ2 is provided with an inert atmosphere (e.g., argon at a pressure of about $4 \times 10^{-3}$ mbar).

The active sputtering bays C4 and C5 in this coat zone CZ2 each have a planar target, although the number and type of targets here can be changed. The target in bay C4 is a metallic silver target, and the target in bay C5 is a metallic titanium target. The substrate is conveyed beneath the silver target at a rate of about 310 inches per minute, while sputtering this target at a power of about 7.1 kW, thereby depositing the first infrared-reflection film region 20 in the form of a silver film having a thickness of about 122 angstroms. The substrate is then conveyed beneath the titanium target in bay C5, while sputtering this target at a power of about 7.8 kW, thereby depositing a first blocker film region 105 in the form of a film comprising titanium and having a thickness of about 20 angstroms.

The substrate 12 is then conveyed through a third coat zone CZ3, a fourth coat zone CZ4, and a fifth coat zone CZ5, in which zones the second transparent dielectric film region 40 is applied in the form of an oxide film comprising zinc and tin. The third CZ3 and fourth CZ4 coat zones each have three active sputtering bays. The fifth coat zone CZ5 has two active sputtering bays (there may, for example, be unused bays along the way). In each of the bays C6-C13, there are mounted two cylindrical targets each comprising (i.e., including a sputterable target material comprising) a compound of zinc and tin. Each of these sputtering bays C6-C13 is provided with an oxidizing atmosphere. For example, the oxidizing atmospheres in the third CZ3, fourth CZ4, and fifth CZ5 coat zones can each consist essentially of oxygen (e.g., about 100% O2) at a pressure of about $4\times10^{-3}$ mbar. Alternatively, one or more of these atmospheres can comprise argon and oxygen.

As shown in Table 5 below, a power of about 50.2 kW is applied to the first two targets in the third coat zone CZ3, a power of about 45.1 kW is applied to the second two targets in this coat zone CZ3, and a power of about 49.5 kW is applied to the third two targets in this zone CZ3. Here, a power of about 53.1 kW is applied to the first two targets in the fourth coat zone CZ4, a power of about 47.7 kW is applied to the second two targets in this coat zone CZ4, and a power of about 44.8 is applied to the third two targets in this zone CZ4. Further, a power of about 49.0 kW is applied to the first two targets in the fifth coat zone CZ5, and a power of about 45.6 kW is applied to the second two targets in this coat zone CZ5. The substrate 12 is conveyed beneath all of the noted targets in coat zones 3-5 (i.e., CZ3 through CZ5), while conveying the substrate at a rate of about 310 inches per minute and sputtering each target at the noted power level, such that the second transparent dielectric film region 40 is applied in the form of an oxide film comprising zinc and tin and having a thickness of about 562 angstroms.

The substrate 12 is then conveyed into a sixth coat zone CZ6 where the second infrared-reflection film region 200 is applied directly over the second transparent dielectric film region 40. The sixth coat zone CZ6 has an inert atmosphere (e.g., argon at a pressure of about $4\times10^{-3}$ mbar). The sputtering bays C14, C15 in this coat zone CZ6 each have a planar target. The target in bay C14 is a metallic silver target, and the target in chamber C15 is a metallic titanium target. A power of about 8.9 kW is applied to the silver target, while the substrate is conveyed beneath this target at a rate of about 310 inches per minute, to deposit the second infrared-reflection film region 200 as a metallic silver film having a thickness of about 149 angstroms. The substrate is then conveyed beneath the metallic titanium target in bay C15, with a power of about 8.1 kW being applied to this target to deposit a second blocker film region 205 comprising titanium and having a thickness of about 20 angstroms.

The substrate 12 is then conveyed through a seventh coat zone CZ7, an eighth coat zone CZ8, and a ninth coat zone CZ9, wherein collectively the third transparent dielectric film region 60 is applied. Each of these coat zones has three sputtering bays, and each such bay is provided with two cylindrical targets (bays C16 through C18 are in CZ7, bays C19 through C21 are in CZ8, and bays C22 through C24 are in CZ9). The targets here all comprise a sputterable material that is a compound of zinc and tin. Each of these coat zones is provided with an oxidizing atmosphere consisting essentially of oxygen (e.g., about 100% $O_2$ at a pressure of about $4\times10^{-3}$ mbar). Alternatively, this atmosphere may comprise argon and oxygen.

A power of about 50.3 kW is applied to the first two targets in the seventh coat zone CZ7, a power of about 45.5 kW is applied to the second two targets in this coat zone, and a power of about 48.9 kW is applied to the third two targets in this zone. A power of about 52.5 kW is applied to the first two targets in the eighth coat zone CZ8, while a power of about 48.2 kW is applied to the second two targets in this coat zone, and a power of about 44.7 kW is applied to the third two targets in this zone. A power of about 49.0 kW is applied to the first two targets in the ninth coat zone CZ9, while a power of about 45.5 kW is applied to the second two targets in this coat zone, and a power of about 47.8 kW is applied to the third two targets in this zone. The substrate is conveyed beneath all of these targets (i.e., beneath all the targets in CZ7-CZ8) at about 310 inches per minute, while sputtering each target at the noted power level, such that the third transparent dielectric film region 60 is applied as an oxide film comprising zinc and tin and having a thickness of about 655 angstroms.

The substrate is then conveyed into a tenth coat zone CZ10 where the third infrared-reflection film region 300 is applied. This coat zone contains an inert atmosphere (e.g., argon at a pressure of about $4\times10^{-3}$ mbar). The active bays C25, C26 in this coat zone are each provided with a planar target. The target in bay C25 is a metallic silver target, and the target in bay C26 is a metallic titanium target. A power of about 12.6 kW is applied to the silver target, while the substrate is conveyed beneath this target at a rate of about 310 inches per minute, thereby depositing the third infrared-reflection film region 300 as a silver film having a thickness of about 206 angstroms. The substrate is then conveyed beneath the titanium target in chamber C26, while sputtering that target at a power level of about 8.1 kW so as to deposit a third blocker film region 305 in the form of a film comprising titanium and having a thickness of about 20 angstroms.

The substrate 12 is then conveyed through an eleventh coat zone CZ11, a twelfth coat zone CZ12, and a thirteenth coat zone CZ13, wherein collectively there is deposited the fourth transparent dielectric film region 80. The eleventh coat zone C11 has three sputtering bays, each with two cylindrical targets (bays C27 through C29 are in CZ11). The twelfth coat zone C12 has only one active sputtering bay C30, and this bay C30 is provided with two cylindrical targets (bay C30 is in CZ12). The thirteenth coat zone CZ13 has three sputtering bays, each provided two cylindrical targets (bays C31 through C33 are in CZ13). Each of the noted targets in coat zones CZ11 through CZ13 comprises a sputterable target material that is a compound of zinc and tin. The coat zones CZ11 through CZ13 are all provided with oxidizing atmospheres, each consisting essentially of oxygen (e.g., about 100% $O_2$ at a pressure of about $4\times10^{-3}$ mbar). Alternatively, one or more of these atmospheres can comprise argon and oxygen.

A power of about 17.9 kW is applied to the first two targets in the eleventh coat zone CZ11, a power of about 21.1 kW is applied to the second two targets in this coat zone CZ11, and a power of about 19.6 kW is applied to the third two targets in this zone CZ11. A power of about 20.1 kW is applied to the two targets in the twelfth coat zone CZ12. A power of about 21.5 kW is applied to the first two targets in the thirteenth coat zone CZ13, a power of about 19.4 kW is applied to the second two targets in this coat zone CZ13, and a power of about 19.3 kW is applied to the third two targets in this zone CZ13. The substrate is conveyed beneath all the targets in CZ11-CZ13 at a rate of about 310 inches per minute, while sputtering each of these targets at the noted power level, such that an inner portion of the fourth transparent dielectric film region 80 is applied as an oxide film comprising zinc and tin and having at a thickness of about 236 angstroms.

Finally, the substrate is conveyed into a fourteenth coat zone CZ14, wherein the outermost portion of the fourth transparent dielectric film region 80 is applied. This coat zone CZ14 has three sputtering bays C34-C36, each containing a nitrogen atmosphere, optionally with some argon, at a pressure of about $4\times10^{-3}$ mbar. The sputtering bays C34-C36 in this coat zone CZ14 are each provided with two cylindrical targets. Each of these targets comprises a sputterable target material of silicon with a small amount of aluminum. A power of about 31.9 kW is applied to the first two targets in the fourteenth coat zone CZ14, a power of about 34.0 kW is applied to the second two targets in this coat zone CZ14, and a power of about 37.4 kW is applied to the third two targets in this zone CZ14. The substrate is conveyed beneath all the targets in CZ14 at about 310 inches per minute, while sputtering each of these targets at the noted power level, such that the outermost portion of the fourth transparent dielectric film region 80 is applied as a nitride film comprising silicon and a small amount of aluminum and having a thickness of about 101 angstroms.

TABLE 5

| Chamber | Power (kW) |
|---|---|
| C1 | 36.7 |
| C2 | 34.6 |
| C3 | 35.5 |
| C4 | 7.1 |
| C5 | 7.8 |
| C6 | 50.2 |
| C7 | 45.1 |
| C8 | 49.5 |
| C9 | 53.1 |
| C10 | 47.7 |
| C11 | 44.8 |
| C12 | 49 |
| C13 | 45.6 |
| C14 | 8.9 |
| C15 | 8.1 |
| C16 | 50.3 |
| C17 | 45.5 |
| C18 | 48.9 |
| C19 | 52.5 |
| C20 | 48.2 |
| C21 | 44.7 |
| C22 | 49.0 |
| C23 | 45.5 |
| C24 | 47.8 |
| C25 | 12.6 |
| C26 | 8.1 |
| C27 | 17.9 |
| C28 | 21.1 |
| C29 | 19.6 |
| C30 | 20.1 |
| C31 | 21.5 |
| C32 | 19.4 |
| C33 | 19.3 |
| C34 | 31.9 |

TABLE 5-continued

| Chamber | Power (kW) |
|---|---|
| C35 | 34.0 |
| C36 | 37.4 |

Table 6 below illustrates another exemplary film stack that can be used as the present coating 7:

TABLE 6

| FILM | STACK E |
|---|---|
| Glass | |
| Zn + O | 159 Å |
| Ag | 122 Å |
| Ti | 20 Å |
| Zn + O | 562 Å |
| Ag | 149 Å |
| Ti | 20 Å |
| Zn + O | 235 Å |
| Si3N4 | 185 Å |
| Zn + O | 235 Å |
| Ag | 206 Å |
| Ti | 20 Å |
| Zn + O | 236 Å |
| Si3N4 | 101 Å |

The film stack of Table 6 exemplifies a group of embodiments wherein the low-emissivity coating is deposited so as to include two film regions comprising transparent dielectric nitride film (optionally consisting essentially of nitride film). These nitride films can, for example, comprise silicon nitride.

In the present embodiments, an infrared-reflective film region can optionally be deposited between the two nitride films. These nitride films (and the infrared-reflective film region between them) are preferably part of a coating comprising, moving outwardly from the top major surface of the substrate, a first transparent dielectric film region, a first infrared-reflective film region comprising silver, a second transparent dielectric film region, a second infrared-reflective film region comprising silver, a third transparent dielectric film region, a third infrared-reflective film region comprising silver, and a fourth transparent dielectric film region. In Table 6, the third silver film is located between the two nitride films. Alternatively, the second silver film may be located between two nitride films, or the second and third silver films may both be located between two nitride films.

In some related method embodiments, the method involves sputtering two series of upper targets in nitriding gas to reactively sputter deposit the two noted nitride films over a top major surface of a substrate. In certain cases, the reactive sputter deposition of the two nitride films results in a combined thickness of at least 100 angstroms, at least 150 angstroms, or at least 200 angstroms, for these two films.

The present embodiments can optionally involve simultaneously sputtering silver in at least three chambers adapted for downward sputtering. Typically, these three chambers will be separated from one another by other chambers that contain reactive sputtering atmospheres and are adapted for sputter depositing transparent dielectric film. This may involve applying an average power of greater than 8.5 kW, or greater than 9.0 kW, on three upper sputtering targets comprising sputterable silver. The deposition methods associated with the present embodiments may involve a coater having an extended series of sputtering chambers, which in certain embodiments includes at least 63 sputtering chambers.

In some of the coating embodiments disclosed herein, the coating may be deposited by sputter depositing dielectric film directly over at least one infrared-reflective film region comprising (optionally consisting essentially of) silver. Here, instead of depositing metallic blocker film directly over each infrared-reflective film region, dielectric film is deposited directly over at least one (or in some cases, over each) of the infrared-reflective film regions. These embodiments may be particularly desirable, for example, when exceptionally high visible transmission is desired. While the thickness of this type of dielectric film can be varied as desired, some embodiments involve a thickness of 75 angstroms or less, or 50 angstroms or less. Other useful thicknesses and details (associated with depositing dielectric film directly over an infrared-reflective film) are described above.

While there have been described what are believed to be preferred embodiments of the present invention, those skilled in the art will recognize that other and further changes and modifications can be made without departing from the spirit of the invention, and all such changes and modifications should be understood to fall within the scope of the invention.

What is claimed is:

1. A first pane having opposed first and second major surfaces, the first pane being part of a multiple-pane insulating glazing unit that includes a second pane, wherein the insulating glazing unit has at least one between-pane space, wherein at least one of the first and second panes has a coated interior surface that is exposed to a between-pane space of the insulating glazing unit, said coated interior surface bearing a low-emissivity coating that includes three infrared-reflection film regions each comprising silver, three blocker film regions and two transparent dielectric film regions, wherein each of the blocker film regions is provided over and contiguous to each of the three infrared-reflection film regions, and wherein at least one of the three blocker film regions comprises nickel.

2. The first pane of claim 1 wherein at least one of the three blocker film regions comprise a combination including nickel together with one or more other metallic materials.

3. The first pane of claim 1 wherein each of the three blocker film regions comprises nickel.

* * * * *